United States Patent
Emerson et al.

(10) Patent No.: US 8,333,631 B2
(45) Date of Patent: Dec. 18, 2012

(54) METHODS FOR COMBINING LIGHT EMITTING DEVICES IN A PACKAGE AND PACKAGES INCLUDING COMBINED LIGHT EMITTING DEVICES

(75) Inventors: David Todd Emerson, Chapel Hill, NC (US); Bernd P. Keller, Santa Barbara, CA (US); Mark McOlear, Cary, NC (US); Peter S. Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 73 days.

(21) Appl. No.: 12/838,677

(22) Filed: Jul. 19, 2010

(65) Prior Publication Data

US 2011/0037080 A1 Feb. 17, 2011

Related U.S. Application Data

(63) Continuation-in-part of application No. 12/425,855, filed on Apr. 17, 2009, now Pat. No. 7,967,652.

(60) Provisional application No. 61/153,889, filed on Feb. 19, 2009.

(51) Int. Cl.
- *H01J 9/00* (2006.01)
- *H01J 1/62* (2006.01)
- *F21V 9/00* (2006.01)

(52) U.S. Cl. ............................ 445/24; 313/503; 362/231

(58) Field of Classification Search ........................ None
See application file for complete search history.

(56) References Cited

U.S. PATENT DOCUMENTS

| | | |
|---|---|---|
| 4,120,026 A | 10/1978 | Tsuchihashi et al. |
| 4,710,699 A | 12/1987 | Miyamoto |
| 5,477,436 A | 12/1995 | Bertling et al. |
| 5,521,708 A | 5/1996 | Beretta |
| 5,803,579 A | 9/1998 | Turnbull et al. |
| 5,851,063 A | 12/1998 | Doughty et al. |
| 6,132,072 A | 10/2000 | Turnbull et al. |
| 6,153,971 A | 11/2000 | Shimizu |
| 6,212,213 B1 | 4/2001 | Weber et al. |

(Continued)

FOREIGN PATENT DOCUMENTS

DE         39 16 875         12/1990

(Continued)

OTHER PUBLICATIONS

International Preliminary Report on Patentability for International Application No. PCT/US2010/023327; Date of Mailing: May 23, 2011; 12 pages.

(Continued)

*Primary Examiner* — Anh Mai
*Assistant Examiner* — Britt D Hanley
(74) *Attorney, Agent, or Firm* — Myers Bigel Sibley & Sajovec, P.A.

(57) ABSTRACT

Methods of forming a light emitting device package assembly include defining a chromaticity region in a two dimensional chromaticity space within a 10-step MacAdam ellipse of a target chromaticity point, and subdividing the defined chromaticity region into at least three chromaticity subregions, providing a plurality of light emitting devices that emit light having a chromaticity that falls within the defined chromaticity region, selecting at least three of the plurality of light emitting devices, wherein each of the three light emitting devices emits light from a different one of the chromaticity subregions. The at least three light emitting devices are selected from chromaticity subregions that are complementary relative to the target chromaticity point to at least one other chromaticity subregion from which a light emitting device is selected.

15 Claims, 14 Drawing Sheets

U.S. PATENT DOCUMENTS

| | | |
|---|---|---|
| 6,234,648 B1 | 5/2001 | Borner et al. |
| 6,319,425 B1 | 11/2001 | Tasaki et al. |
| 6,337,536 B1 | 1/2002 | Matsubara et al. |
| 6,373,188 B1 | 4/2002 | Johnson et al. |
| 6,441,558 B1 | 8/2002 | Muthu et al. |
| 6,480,299 B1 | 11/2002 | Drakopoulos et al. |
| 6,513,949 B1 | 2/2003 | Marshall et al. |
| 6,538,371 B1 | 3/2003 | Duggal et al. |
| 6,547,249 B2 | 4/2003 | Collins, III et al. |
| 6,550,949 B1 | 4/2003 | Bauer et al. |
| 6,552,495 B1 | 4/2003 | Chang |
| 6,577,073 B2 | 6/2003 | Shimizu et al. |
| 6,600,175 B1 | 7/2003 | Baretz et al. |
| 6,600,324 B2 | 7/2003 | St. Germain |
| 6,616,862 B2 | 9/2003 | Srivastava et al. |
| 6,624,638 B2 | 9/2003 | St. Germain |
| 6,635,503 B2 | 10/2003 | Andrews et al. |
| 6,636,003 B2 | 10/2003 | Rahm et al. |
| 6,642,666 B1 | 11/2003 | St. Germain |
| 6,685,852 B2 | 2/2004 | Setlur et al. |
| 6,692,136 B2 | 2/2004 | Marshall et al. |
| 6,703,173 B2 | 3/2004 | Lu et al. |
| 6,737,801 B2 | 5/2004 | Ragle |
| 6,744,194 B2 | 6/2004 | Fukasawa et al. |
| 6,762,563 B2 | 7/2004 | St. Germain et al. |
| 6,784,463 B2 | 8/2004 | Camras et al. |
| 6,817,735 B2 | 11/2004 | Shimizu et al. |
| 6,841,804 B1 | 1/2005 | Chen et al. |
| 6,853,010 B2 | 2/2005 | Slater, Jr. et al. |
| 6,882,101 B2 | 4/2005 | Ragle |
| 6,885,035 B2 | 4/2005 | Bhat et al. |
| 6,900,471 B1 | 5/2005 | Wicke et al. |
| 6,914,267 B2 | 7/2005 | Fukasawa et al. |
| 6,936,857 B2 | 8/2005 | Doxsee et al. |
| 6,957,899 B2 | 10/2005 | Jiang et al. |
| 6,967,116 B2 | 11/2005 | Negley |
| 7,005,679 B2 | 2/2006 | Tarsa et al. |
| 7,008,078 B2 | 3/2006 | Shimizu et al. |
| 7,009,199 B2 | 3/2006 | Hall |
| 7,009,343 B2 | 3/2006 | Lim et al. |
| 7,014,336 B1 | 3/2006 | Ducharme et al. |
| 7,023,019 B2 | 4/2006 | Maeda et al. |
| 7,066,623 B2 | 6/2006 | Lee et al. |
| 7,095,056 B2 | 8/2006 | Vitta et al. |
| 7,125,143 B2 | 10/2006 | Hacker |
| 7,135,664 B2 | 11/2006 | Vornsand et al. |
| 7,141,442 B2 | 11/2006 | Sano |
| 7,207,691 B2 | 4/2007 | Lee et al. |
| 7,213,940 B1 | 5/2007 | Van De Ven et al. |
| 7,213,942 B2 | 5/2007 | Jiang et al. |
| 7,217,583 B2 | 5/2007 | Negley et al. |
| 7,221,044 B2 | 5/2007 | Fan et al. |
| 7,250,715 B2 | 7/2007 | Mueller et al. |
| 7,256,557 B2 | 8/2007 | Lim et al. |
| 7,263,583 B2 | 8/2007 | Radkov |
| 7,278,760 B2 | 10/2007 | Heuser et al. |
| 7,354,172 B2 | 4/2008 | Chemel et al. |
| 7,358,954 B2 | 4/2008 | Negley et al. |
| 7,365,485 B2 | 4/2008 | Fukasawa et al. |
| 7,387,405 B2 | 6/2008 | Ducharme et al. |
| 7,417,259 B2 | 8/2008 | Sakai et al. |
| 7,422,504 B2 | 9/2008 | Maeda et al. |
| 7,453,195 B2 | 11/2008 | Radkov |
| 7,473,934 B2 | 1/2009 | Nagai et al. |
| 7,564,180 B2 | 7/2009 | Brandes |
| 2003/0030063 A1 | 2/2003 | Sosniak et al. |
| 2003/0042908 A1 | 3/2003 | St. Germain |
| 2003/0076056 A1 | 4/2003 | Schuurmans |
| 2003/0089918 A1 | 5/2003 | Hiller et al. |
| 2004/0046178 A1 | 3/2004 | Sano |
| 2004/0105264 A1 | 6/2004 | Spero |
| 2004/0218387 A1 | 11/2004 | Gerlach |
| 2004/0264193 A1 | 12/2004 | Okumura |
| 2005/0030744 A1 | 2/2005 | Ducharme et al. |
| 2005/0135094 A1 | 6/2005 | Lee et al. |
| 2005/0259423 A1 | 11/2005 | Heuser et al. |
| 2005/0259439 A1 | 11/2005 | Cull et al. |
| 2006/0012989 A1 | 1/2006 | Lee |
| 2006/0022582 A1 | 2/2006 | Radkov |
| 2006/0098077 A1 | 5/2006 | Dowling |
| 2006/0105482 A1 | 5/2006 | Alferink et al. |
| 2006/0113548 A1 | 6/2006 | Chen et al. |
| 2006/0138435 A1 | 6/2006 | Tarsa et al. |
| 2006/0181192 A1 | 8/2006 | Radkov et al. |
| 2006/0245184 A1 | 11/2006 | Galli |
| 2007/0001188 A1 | 1/2007 | Lee |
| 2007/0051966 A1 | 3/2007 | Higashi et al. |
| 2007/0090381 A1 | 4/2007 | Otsuka et al. |
| 2007/0139920 A1 | 6/2007 | Van De Ven et al. |
| 2007/0139923 A1 | 6/2007 | Negley et al. |
| 2007/0170447 A1 | 7/2007 | Negley et al. |
| 2007/0171145 A1 | 7/2007 | Coleman et al. |
| 2007/0202623 A1 | 8/2007 | Gao et al. |
| 2007/0216704 A1 | 9/2007 | Roberts et al. |
| 2007/0223219 A1 | 9/2007 | Medendorp, Jr. et al. |
| 2007/0236911 A1 | 10/2007 | Negley |
| 2007/0263393 A1 | 11/2007 | Van De Ven |
| 2007/0267983 A1 | 11/2007 | Van De Ven et al. |
| 2007/0274063 A1 | 11/2007 | Negley |
| 2007/0274080 A1 | 11/2007 | Negley et al. |
| 2007/0276606 A1 | 11/2007 | Radkov et al. |
| 2007/0278503 A1 | 12/2007 | Van De Ven et al. |
| 2007/0278934 A1 | 12/2007 | Van De Ven et al. |
| 2007/0279440 A1 | 12/2007 | Negley |
| 2007/0279903 A1 | 12/2007 | Negley et al. |
| 2007/0280624 A1 | 12/2007 | Negley et al. |
| 2008/0084685 A1 | 4/2008 | Van De Ven et al. |
| 2008/0084700 A1 | 4/2008 | Van De Ven |
| 2008/0084701 A1 | 4/2008 | Van De Ven et al. |
| 2008/0088248 A1 | 4/2008 | Myers |
| 2008/0089053 A1 | 4/2008 | Negley |
| 2008/0106895 A1 | 5/2008 | Van De Ven et al. |
| 2008/0106907 A1 | 5/2008 | Trott et al. |
| 2008/0112168 A1 | 5/2008 | Pickard |
| 2008/0112170 A1 | 5/2008 | Trott et al. |
| 2008/0112183 A1 | 5/2008 | Negley |
| 2008/0130265 A1 | 6/2008 | Negley et al. |
| 2008/0130285 A1 | 6/2008 | Negley et al. |
| 2008/0130298 A1 | 6/2008 | Negley et al. |
| 2008/0136313 A1 | 6/2008 | Van De Ven et al. |
| 2008/0137347 A1 | 6/2008 | Trott et al. |
| 2008/0179602 A1 | 7/2008 | Negley et al. |
| 2008/0211416 A1 | 9/2008 | Negley et al. |
| 2008/0259589 A1 | 10/2008 | Van De Ven |
| 2008/0278928 A1 | 11/2008 | Van De Ven et al. |
| 2008/0278940 A1 | 11/2008 | Van De Ven et al. |
| 2008/0278950 A1 | 11/2008 | Pickard et al. |
| 2008/0278952 A1 | 11/2008 | Trott et al. |
| 2008/0290004 A1 | 11/2008 | Tsai et al. |
| 2008/0304260 A1 | 12/2008 | Van De Ven et al. |
| 2008/0304261 A1 | 12/2008 | Van De Ven et al. |
| 2008/0304269 A1 | 12/2008 | Pickard et al. |
| 2008/0309255 A1 | 12/2008 | Myers et al. |
| 2008/0310154 A1 | 12/2008 | Van De Ven et al. |
| 2009/0050907 A1 | 2/2009 | Yuan et al. |
| 2009/0097271 A1 | 4/2009 | Chen et al. |
| 2009/0108269 A1 | 4/2009 | Negley et al. |
| 2009/0117672 A1 | 5/2009 | Caruso et al. |
| 2009/0128460 A1 | 5/2009 | Roberts et al. |
| 2009/0129074 A1 | 5/2009 | Roberts et al. |
| 2009/0160363 A1 | 6/2009 | Negley et al. |
| 2009/0161356 A1 | 6/2009 | Negley et al. |
| 2009/0184616 A1 | 7/2009 | Van De Ven et al. |
| 2009/0184666 A1 | 7/2009 | Myers et al. |
| 2009/0246895 A1 | 10/2009 | You et al. |

FOREIGN PATENT DOCUMENTS

| | | |
|---|---|---|
| DE | 42 28 895 | 3/1994 |
| DE | 103 35 077 | 3/2005 |
| EP | 0 838 866 | 4/1998 |
| EP | 0 971 421 A2 | 1/2000 |
| EP | 1 024 399 A1 | 8/2000 |
| EP | 1 160 883 A2 | 12/2001 |
| EP | 1 193 772 A2 | 4/2002 |
| EP | 1 367 655 A1 | 12/2003 |
| EP | 1 462 711 | 12/2004 |
| EP | 1 566 848 | 8/2005 |

| | | |
|---|---|---|
| EP | 1 850 383 | 10/2007 |
| JP | 10-163535 | 6/1998 |
| JP | 2000-183408 | 6/2000 |
| JP | 2000-294834 | 10/2000 |
| JP | 2001 156331 | 6/2001 |
| JP | 2001/307506 | 11/2001 |
| JP | 2002-150821 | 5/2002 |
| JP | 2003-515956 | 5/2003 |
| JP | 2003-529889 | 10/2003 |
| JP | 2004-080046 | 3/2004 |
| JP | 2004-103443 | 4/2004 |
| JP | 2004-253309 | 9/2004 |
| JP | 2004-356116 | 12/2004 |
| JP | 2004-363055 | 12/2004 |
| JP | 2005-142311 | 6/2005 |
| JP | 2007-122950 | 5/2007 |
| JP | 2007-141737 | 6/2007 |
| KR | 2007002211 A | 1/2007 |
| WO | WO 00/19546 | 4/2000 |
| WO | WO 01/41215 | 6/2001 |
| WO | WO 2005/004202 A2 | 1/2005 |
| WO | WO 2005/013365 | 2/2005 |
| WO | WO 2005/022030 | 3/2005 |
| WO | WO 2005/096258 A1 | 10/2005 |
| WO | WO 2005/124877 | 12/2005 |
| WO | WO 2006/028312 | 3/2006 |
| WO | WO 2007/060573 A1 | 5/2007 |
| WO | WO 2007/125623 A1 | 11/2007 |

OTHER PUBLICATIONS

U.S. Appl. No. 61/075,513, filed Jun. 25, 2008, Roberts.
U.S. Appl. No. 61/041,404, filed Apr. 1, 2008, Negley.
U.S. Appl. No. 61/039,926, filed Mar. 27, 2008, Myers.
U.S. Appl. No. 61/037,365, filed Mar. 18, 2008, Van De Ven.
U.S. Appl. No. 61/022,886, filed Jan. 23, 2008, Myers.
U.S. Appl. No. 60/990,724, filed Nov. 28, 2007, Negley.
U.S. Appl. No. 60/990,435, filed Nov. 27, 2007, Van Den Ven.
U.S. Appl. No. 60/990,439, filed Nov. 27, 2007, Negley.
U.S. Appl. No. 60/978,880, filed Oct. 10, 2007, Van De Ven.
U.S. Appl. No. 60/868,134, filed Dec. 1, 2006, Van De Ven.
U.S. Appl. No. 60/793,524, filed Apr. 20, 2006, Van De Ven.
U.S. Appl. No. 60/792,859, filed Apr. 18, 2006, Van De Ven.
"Cree XLamp XR-E and XR-C LED Binning and Labeling", pp. 1-15, Copyright 2007-2008 Cree, Inc. Application Noted: CLD-AP12.008.
"LED Binning" Cree LED Light, pp. 1-12 (Copyright 2007).
Apparatus and Methods for Combining Light Emitters, Specifications and Drawings corresponding to U.S. Appl. No. 12/057,748, filed Mar. 28, 2008.
Cree® XLamp® 7090 XR-E Series LED Binning and Labeling.
Dowling, "Standards required for further penetration of solid-state lighting", LEDs Magazine Apr. 2007, http://www.ledsmagazine.com/features/4/4/10>, Last Download: Mar. 12, 2009, pp. 28-31, XP007907637.
International Search Report and Written Opinion (13 pages.) corresponding to International Application No. PCT/US2008/012538; Mailing Date: Mar. 23, 2009.
International Search Report and Written Opinion (18 pages.) corresponding to International Application No. PCT/US2008/012549; Mailing Date: Mar. 23, 2009.
International Search Report and Written Opinion corresponding to International Application No. PCT/US2007/009462; Mailing Date: Oct. 24, 2008.
International Search Report and Written Opinion corresponding to International Application No. PCT/US2007/009459; Mailing Date: Mar. 3, 2008.
International Search Report and Written Opinion corresponding to International Application No. PCT/US2008/054665; Mailing Date: Jul. 16, 2008.
International Search Report and Written Opinion corresponding to International Application No. PCT/US2007/086593; Mailing Date: Apr. 18, 2008.
International Search Report and Written Opinion corresponding to International Application No. PCT/US2006/048654; Mailing Date: Feb. 13, 2008.
International Search Report and Written Opinion corresponding to International Application No. PCT/US2008/063042; Mailing Date: Jul. 21, 2008.
International Search Report and Written Opinion corresponding to International Application No. PCT/US2007/086027; Mailing Date: Apr. 25, 2008.
International Search Report and Written Opinion corresponding to International Application No. PCT/US2008/063021; Mailing Date: Aug. 5, 2008.
International Search Report and Written Opinion corresponding to International Application No. PCT/US2008/051633; Mailing Date: Aug. 14, 2008.
International Search Report and Written Opinion corresponding to International Application No. PCT/US2008/063016; Mailing Date: Aug. 5, 2008.
International Search Report and Written Opinion corresponding to International Application No. PCT/US2008/063027; Mailing Date: Jul. 23, 2008.
International Search Report and Written Opinion corresponding to International Application No. PCT/US2007/09629; Mailing Date: Feb. 11, 2008.
International Search Report and Written Opinion corresponding to International Application No. PCT/US2008/079299; Mailing Date: Jan. 9, 2009.
International Search Report and Written Opinion corresponding to International Application No. PCT/US2008/063020; Mailing Date: Jul. 21, 2008.
International Search Report and Written Opinion corresponding to International Application No. PCT/US2009/003768; Mailing Date: Sep. 24, 2009.
International Search Report and Written Opinion for corresponding PCT Application No. PCT/US2010/023327 dated Jul. 1, 2010.
Krames, "Lumileds Lighting, Light from Silicon Valley" Progress and Future Direction of LED Technology, SSL Workshop, Nov. 13, 2003, pp. 1-21.
Mirhosseini, et al. "Improved Color Rendering and Luminous Efficacy in Phosphor-Converted White Light-Emitting Diodes by Use of Dual-Blue Emitting Active Regions" Optical Society of America 17(13):10806-10813 (2009).
Nichia, "Light Emitting Diode (InGan LED): Surface Mount Type LED Chromaticity Diagram", http://www.nichia.com/product/smd-color.html>, Last Download: Mar. 12, 2009 (Jan. 1, 2005) XP007907628.
Ohno, "Simulation Analysis of White LED Spectra and Color Rendering" National Institute of Standards and Technology, USA, pp. 1-4.
Specifications for the Chromaticity of Solid State Lighting Products American National Standard Lighting Group, ANSI_NEMA_ANSLG C78.377-2008, pp. 1-17 (Jan. 9, 2008).
Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting.
Wyszecki et al., "Precision of Color Matching for Normal Trichromats: MacAdam Ellipses", Color Science; Concepts and Methods, Quantitative Data and Formulae, pp. 306-313 (Jan. 1, 1982) XP002230956.

| LUMINOUS FLUX BINS | | |
|---|---|---|
| BIN | MIN (lm) | MAX (lm) |
| V1 | 100 | 110 |
| V2 | 110 | 120 |
| V3 | 120 | 130 |

METHODS FOR COMBINING LIGHT EMITTING DEVICES IN A PACKAGE AND PACKAGES INCLUDING COMBINED LIGHT EMITTING DEVICES

RELATED APPLICATIONS

The present application is a continuation-in-part of U.S. patent application Ser. No. 12/425,855, filed Apr. 17, 2009, now U.S. Pat. No. 7,967,652 entitled "METHODS FOR COMBINING LIGHT EMITTING DEVICES IN A PACKAGE AND PACKAGES INCLUDING COMBINED LIGHT EMITTING DEVICES," which application claims the benefit of and priority to U.S. Provisional Patent Application No. 61/153,889, filed Feb. 19, 2009, entitled "METHODS FOR COMBINING LIGHT EMITTING DEVICES IN A PACKAGE AND PACKAGES INCLUDING COMBINED LIGHT EMITTING DEVICES," the disclosures of which are hereby incorporated herein by reference in their entirety.

FIELD OF THE INVENTION

The present invention relates to lighting, and more particularly to selecting lighting components used in lighting assemblies and light emitting packages including selected lighting components.

BACKGROUND

Solid state lighting devices are used for a number of lighting applications. A lighting panel including solid state lighting sources may be used, for example, for general illumination in a lighting fixture, or as a backlighting unit for an LCD display. Lighting panels commonly employ an arrangement of multiple light emitters such as fluorescent tubes and/or light emitting diodes (LED). An important attribute of the multiple light emitters may include uniformity of color and/or luminance in displayed output. In some cases, the light emitters may include multiple LED chips.

Presently, LED chips may be tested and grouped and/or binned according to their respective output and/or performance characteristics prior to being mounted in an LED package. The grouping may be performed using, for example, chromaticity values, such as the x, y values used in the CIE 1931 chromaticity diagram that was created by the International Commission on Illumination in 1931. In this manner, each light emitting device may be characterized by x, y coordinates. Emitters having similar x, y values may be grouped or binned to be used together, i.e., to be mounted together in a single LED package.

SUMMARY

A method of forming a light emitting device assembly according to some embodiments includes providing a light emitting device assembly body, defining a chromaticity region in a two dimensional chromaticity space the chromaticity region may be defined within a 10-step MacAdam ellipse of a target chromaticity point, and subdividing the defined chromaticity region into at least three chromaticity subregions. A plurality of light emitting devices that emit light having a chromaticity that falls within the defined chromaticity region may be provided, and at least three of the plurality of light emitting devices may be selected. Each of the three light emitting devices may have a chromaticity point in a different one of the chromaticity subregions and the at least three light emitting devices may be selected from chromaticity subregions that may be complementary relative to the target chromaticity point to at least one other chromaticity subregion from which a light emitting device may be selected The selected light emitting devices may be mounted on the light emitting device assembly body.

The target chromaticity point may be on the black body locus and may have a correlated color temperature between 2600K and 6600K.

Selecting the at least three light emitting devices may include selecting at least two sets of light emitting devices. Each set of light emitting devices may include at least two light emitting devices selected from chromaticity subregions that may be complementary relative to the target chromaticity point.

The chromaticity region may encompass a defined bin in the two dimensional chromaticity space, and the defined bin may include a quadrangle on a two dimensional chromaticity space that may have a width equal to a major axis of a 7-step MacAdam ellipse in the two dimensional chromaticity space. Each of the at least three chromaticity subregions may at least partially overlap the defined bin.

A combined light from the at least three light emitting devices may fall within a target chromaticity region that may be a subset of the defined bin.

The defined chromaticity region may be larger than and encompasses the defined bin, and the target chromaticity region touches an edge of the defined bin.

The target chromaticity region may have an area on a two dimensional chromaticity space that may be about the size of a 2-step MacAdam ellipse in the two dimensional chromaticity space.

The target chromaticity region may have an area on a two dimensional chromaticity space that may be smaller than a 2-step MacAdam ellipse in the two dimensional chromaticity space.

The light emitting devices may include phosphor-coated blue light emitting device chips.

The methods may further include defining a second chromaticity region in a two dimensional chromaticity space the second chromaticity region may be defined within a 10-step MacAdam ellipse of a second target chromaticity point and the second chromaticity region does not overlap with the first chromaticity region, and subdividing the second chromaticity region into at least three second chromaticity subregions, providing a second plurality of light emitting devices that emit light having a chromaticity that falls within at least one of the second chromaticity subregions, and selecting at least three of the second plurality of light emitting devices. Each of the three light emitting devices of the second plurality of light emitting devices emits light from a different one of the second chromaticity subregions. The selected light emitting devices of the second plurality of light emitting devices may be on the light emitting device package body.

The second chromaticity region may include light having a dominant wavelength greater than about 600 nm.

The methods may further include defining a third chromaticity region in a two dimensional chromaticity space, and subdividing the third chromaticity region into at least three third chromaticity subregions the third chromaticity region does not overlap with the first and/or second chromaticity regions, providing a third plurality of light emitting devices that emit light having a chromaticity that falls within at least one of the third chromaticity subregions, and selecting at least three of the third plurality of light emitting devices. Each of the three light emitting devices of the third plurality of light emitting devices emits light from a different one of the third chromaticity subregions. The selected light emitting devices of the third plurality of light emitting devices may be mounted on the light emitting device package body.

The first chromaticity region may include light having a chromaticity point that may be within a 10-step MacAdam ellipse of a point on the black body locus having a correlated color temperature between 2600K and 6600K, the second chromaticity region may include light having a dominant wavelength greater than about 600 nm, and the third chromaticity region may include light having x, y color coordinates within an area on a 1931 CIE Chromaticity Diagram defined by points having coordinates (0.32, 0.40), (0.36, 0.48), (0.43, 0.45), (0.42, 0.42), (0.36, 0.38).

The defined subregions include a plurality of pairs of complementary subregions, respective subregions in a pair of complementary subregions may be arranged opposite a center point of the chromaticity region from one another, selecting the at least three of the plurality of light emitting devices may include selecting at least four of the plurality of light emitting devices from at least four chromaticity subregions in pairs from respective pairs of complementary subregions.

Selecting a pair of light emitting device from one pair of complementary subregions may include selecting a first light emitting device having a first luminous flux from a first subregion that may have a center point that may be located a first distance from a center point of the chromaticity region, and selecting a second light emitting device having a second luminous flux from a second subregion that may be complementary to the first subregion and that may have a center point that may be located a second distance from a center point of the chromaticity region, the first distance may be smaller than the second distance and the first luminous flux may be larger than the second luminous flux.

The at least three light emitting devices may be selected from at least three chromaticity subregions that may be complementary relative to the target chromaticity point.

A light emitting device assembly according to some embodiments includes a light emitting device assembly body, and at least three light emitting devices on the assembly body. Each of the at least three light emitting devices emits light having a chromaticity that falls within a defined chromaticity region in a two dimensional chromaticity space. The chromaticity region may be defined within a 10-step MacAdam ellipse of a target chromaticity point that may be on the black body locus and that may have a correlated color temperature between 2600K and 6600K. The defined chromaticity region may be subdivided into at least three chromaticity subregions. The at least three light emitting devices emit light when energized that falls within chromaticity subregions that may be complementary relative to the target chromaticity point to at least one other chromaticity subregion in which a light emitting device in the light emitting device assembly emits light.

A lighting fixture according to some embodiments includes a light emitting device package assembly as described above.

DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

Figure 1A:
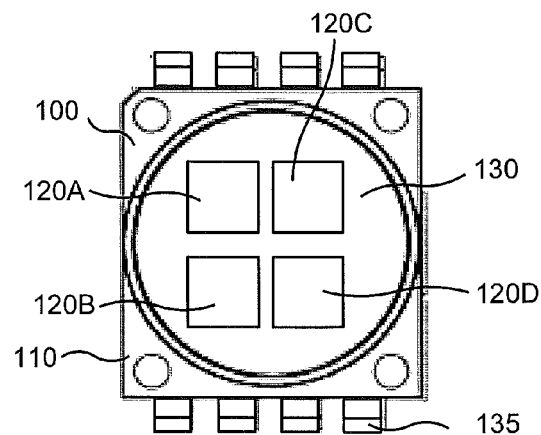
FIG. 1A is a plan view of a packaged light emitting diode according to some embodiments.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1B:
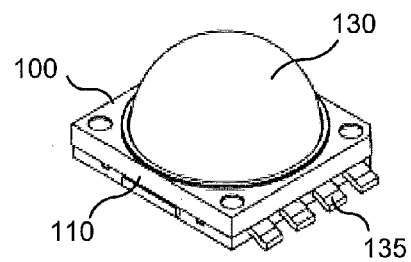
FIG. 1B is a perspective view of a packaged light emitting diode according to some embodiments.
Figure 1C:
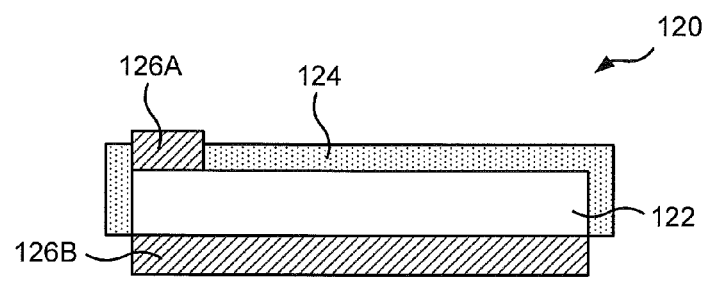
FIG. 1C illustrates an LED die that can be used in a packaged light emitting diode according to some embodiments.

Reference is now made to FIGS. 1A, 1B and 1C. FIG. 1A is a schematic plan view. FIG. 1B is a perspective view illustrating a light emitting device (LED) package 100 including multiple light emitting devices (or light emitters) 120A-120D that are selected and grouped according to some embodiments of the present invention. FIG. 1C illustrates an example of a light emitter 120 including an LED chip 122 that includes top and bottom anode/cathode contacts 126A, 126B and that is coated with a wavelength conversion phosphor 124 according to some embodiments. In some embodiments, the light emitter 120 may itself include a packaged single or multi-chip LED device, and the LED package 100 may include a fixture, panel or luminaire in which a plurality of packaged light emitters 120 are mounted.

The LED package 100 may include a multi-chip module as described, for example, in U.S. patent application Ser. No. 12/154,691 filed May 23, 2008, the disclosure of which is incorporated herein by reference as if fully set forth herein in its entirety. In some embodiments, the light emitters 120A-120D may have both anode and cathode contacts on the same side of the device. Accordingly, the present invention is not limited to devices including light emitters having a vertical device structure with anode and cathode contacts on opposite sides of the device.

In particular embodiments, the LED package 100 includes multiple light emitters 120A-120D mounted within a package body 110. Although four light emitters 120A-120D are illustrated, the package 100 could include more or fewer light emitters therein. A lens 130 may be affixed over the light emitters 120A-120D to provide a desired angular emission pattern of light from the light emitters 120A-120D, and/or to increase light extraction from the LED package 100. In some embodiments, the light emitters 120A-120D may be covered or coated with a wavelength conversion material, such as a phosphor, that converts at least a portion of light emitted by the light emitters 120A-120D to a different wavelength or color. A plurality of electrical leads 135 provide electrical connection to the light emitters 120A-120D in the package 100. Each of the light emitters 120A-120D in the package 100 may be individually addressable. That is, the package may include separate anode/cathode leads from among the electrical leads 135 for each of the light emitters 120A-120D. Having individually addressable light emitters may permit the light emitters to be individually controlled, for example driven at different current levels, which may enable a lighting system to compensate for brightness variations among the light emitters in a given package 100 to achieve a desired color point.

In particular embodiments, the LED package 100 may include a multi-chip LED package, such as an MC-E LED available from Cree, Inc., the assignee of the present invention.

In particular embodiments, the LED package 100 may include four phosphor coated power LED chips having dimensions of about 1000 μm×1000 μm or more. Some embodiments provide a 7 mm×9 mm LED package including four 1.4 mm×1.4 mm phosphor coated power LED chips. Such a package may be capable of generating more than 1,000 lumens of light output at 700 mA using approximately 9.8 W of power. One thousand lumens is approximately equivalent to the light produced by a standard 75 watt incandescent light bulb.

Some embodiments may provide binning and chip selection techniques for use in LED package manufacturing that may provide extremely tightly color-matched LEDs in an LED package. In particular, binning and chip selection techniques according to some embodiments may provide a tighter (i.e. narrower or smaller) color distribution than previously available, allowing users to address applications with very tight color requirements and/or reducing waste of LED chips that previously could not be used in a particular packaging application. In particular embodiments, a color distribution can be achieved that is about 79% tighter than can be achieved with standard binning techniques.

In some embodiments, the light emitters 120A-120D may be grouped and/or selected for inclusion in a particular LED package 100 responsive to the combined chromaticity and/or luminous flux values of the light emitters 120A-120D. Chromaticities of the light emitters 120A-120D may be selected so that the combined light, that is a mixture of light from the light emitters 120A-120D, may have a desired chromaticity. In this manner, the perceived color of light generated by the LED package 100 may appear to have a desired chromaticity, e.g. white, based on the apparent chromaticity of the combination, even if none (or fewer than all) of the light emitters 120A-120D individually emits light having the desired chromaticity. Furthermore, in some embodiments, the luminous flux of the light emitters 120A-120D may be selected so that the combined mixture of light has a desired luminous flux level.

Figure 2:
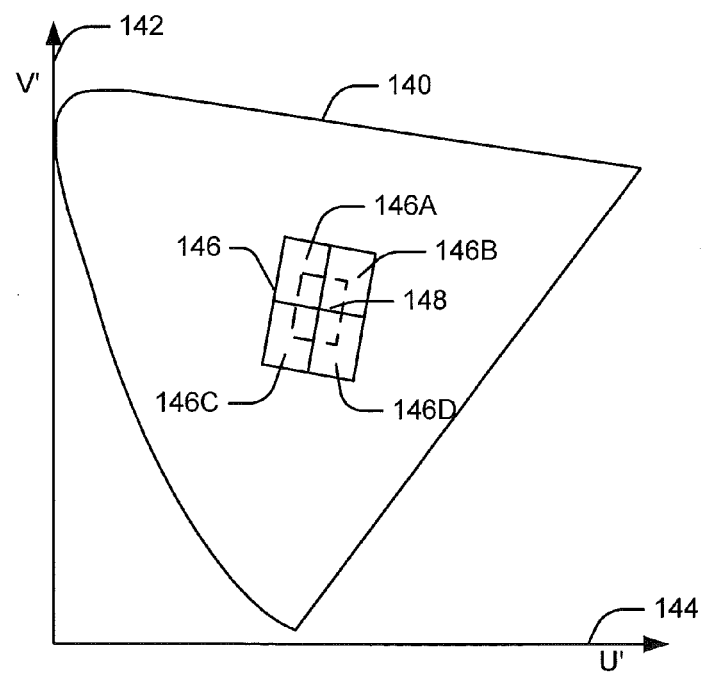
FIG. 2 is a chromaticity diagram illustrating a chromaticity region corresponding to light emitters having similar chromaticity coordinates according to some embodiments.

For example, reference is made to FIG. 2, which is a two-dimensional chromaticity diagram illustrating a chromaticity region 146 within a chromaticity space 140. It will be appreciated that a chromaticity diagram is a two-dimensional representation of all visible colors. Each visible color, which has a distinct hue and saturation, can be represented by a point in the diagram. Various chromaticity spaces have been defined, including the 1931 CIE chromaticity space and the 1976 CIE chromaticity space created by the International Commission on Illumination (CIE).

The light emitted by a light emitter 120A-120D may be represented by a point on a chromaticity diagram. Consequently, a region on a chromaticity diagram may represent light emitters having similar chromaticity coordinates.

The chromaticity region 146 is subdivided into multiple chromaticity subregions (or simply subregions) 146A-146D. The subregions 146A-146D may correspond to multiple groups of light emitters having similar chromaticity coordinates. As illustrated in FIG. 2, the chromaticity space 140 may be defined in terms of u' and v' axes 144, 142 such that any point in the color space may be expressed as a coordinate pair (u', v'). It will be appreciated that the chromaticity region 146 shown in FIG. 2 may be in any desired location within the chromaticity space 140 and may have any desired size or shape. The size, shape and location of the chromaticity region 146 in FIG. 2 are arbitrary and are shown for illustrative purposes only.

According to some embodiments, an LED package 100 includes a plurality of N light emitters 120A-120D. Although the LED package 100 of FIG. 1 is illustrated as including four (4) light emitters, it will be appreciated that N could be any number greater than two (2). Each of the N light emitters 120A-120D has a chromaticity that falls within one of N subregions 146A-146D defined within a chromaticity region 146. The combined light from the N light emitters 120A-120D may fall within a target chromaticity region 148 that is defined within and is smaller than the chromaticity region 146 within which the N subregions 146A-146D are defined.

For example, an LED package 100 according to some embodiments may include first to fourth light emitters 120A to 120D that are selected based on their chromaticity points falling within one of first to fourth emitter group subregions 146A-146D. For example, one of the light emitters 120A may have a chromaticity that falls within a first subregion 146A, one of the light emitters 120B may have a chromaticity that falls within a second subregion 146B, one of the light emitters 120C may have a chromaticity that falls within a third subregion 146C, and one of the light emitters 120D may have a chromaticity that falls within a fourth subregion 146D.

It will be appreciated, however, that it may not be necessary for an LED package 100 to include a light emitter 120A-120D from each of the defined subregions 146A-146D, depending on the chromaticities of the selected light emitters 120A-120D. Furthermore, each of the light emitters 120A-120D does not have to be in a unique subregion 146A-146D. For example, more than one of the light emitters 120A-120D may fall within a single subregion 146A-146D.

In some embodiments, the subregions may be defined such that each subregion in the plurality of subregions shares a boundary line with at least two other subregions. Also, each subregion may at least partially overlap the target chromaticity region 148. In some embodiments, the subregions 146A-146D may completely fill the chromaticity region 146, so that a chromaticity point in the chromaticity region 146 falls within at least one defined subregion.

Accordingly, some embodiments define a chromaticity region 146 that is larger than and encompasses a target chromaticity region 148. The chromaticity region 146 is further divided into a plurality of N subregions 146A to 146D that are arranged in a two-dimensional matrix of subregions. An LED package 100 includes a plurality of N light emitters 120A to 120D, each of which has a chromaticity that falls within one of the N subregions 146A to 146D.

In some embodiments, the chromaticity of an individual light emitter 120A-120D may be determined based on the color of light emission from the light emitter 120A-120D without any color conversion or shifting using phosphors or other luminophoric material. Alternatively, in some embodiments, the chromaticity of an individual light emitter 120A-120D may be determined based on the combined color of light emission from the light emitter 120A-120D and of light emission from a phosphor that is stimulated by the emission from the light emitter 120A-120D. For example, in some embodiments, the light emitters 120A-120D may comprise blue and/or ultraviolet LEDs that are coated with a phosphor or phosphor-bearing material that is arranged to receive at least some light emitted by the light emitters 120A-120D and to responsively emit light having a different wavelength. The combined light emitted by the light emitter and the phosphor may appear white. Such color conversion is well known in the art.

Phosphor coating of LED chips is described, for example, in U.S. Pat. Nos. 6,853,010 and 7,217,583, the disclosures of which are incorporated herein by reference as if fully set forth herein.

In some embodiments, one or more of the light emitters 120A-120D may be coated with phosphor, while one or more of the light emitters 120A-120D may not be coated with phosphor. In some embodiments, none of the light emitters 120A-120D may be coated with phosphor.

In some embodiments, light emitters 120A-120D may be selected for inclusion in an LED package 100 based on their chromaticity points being about equidistant from the target chromaticity region 148, or a desired chromaticity point within the target chromaticity region 148, or being in subregions 146A-146D that are about equidistant from the desired chromaticity point or region. However, it will be appreciated that the chromaticity points of the light emitters 120A-120D need not be equidistant from the desired chromaticity point or region.

In some embodiments, the desired chromaticity point or region 148 may be different from the chromaticity of light emitted by some or all of the light emitters 120A-120D in the package 100. For example, in some embodiments, an LED package 100 includes four light emitters 120A-120D. Some, e.g., three, of the light emitters 120A-120C may include blue light emitting diodes coated with a yellow phosphor and having a combined light emission (chip plus phosphor) that appears yellow-green to an observer. As used herein, "white light" generally refers to light having a chromaticity point that is within a 10-step MacAdam ellipse of a point on the black body locus (BBL) having a correlated color temperature (CCT) between 2600K and 6600K, while "yellow-green light" generally refers to light having x, y color coordinates within an area on a 1931 CIE Chromaticity Diagram defined by points having coordinates (0.32, 0.40), (0.36, 0.48), (0.43, 0.45), (0.42, 0.42), (0.36, 0.38), as described in detail in U.S. Pat. No. 7,213,940, the disclosure of which is incorporated herein by reference. Thus, the target chromaticity region 148 for combined light from the three light emitters 120A-120C may not be in a region of a chromaticity space that is conventionally designated as "white." The fourth light emitter may comprise a red LED that emits light at a wavelength selected such that combined light from all four light emitters 120A-120D appears white to an observer, and in some embodiments falls along the black body locus.

Figure 3A:
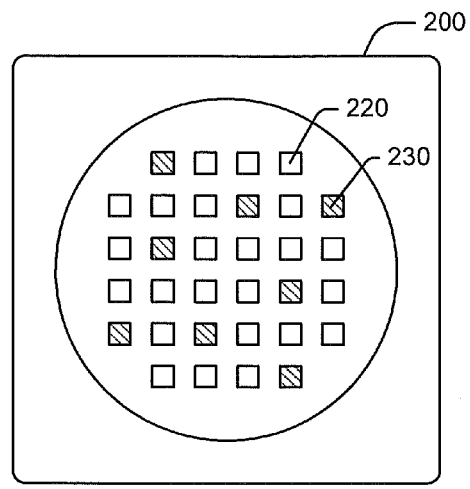
FIG. 3A is a plan view of a packaged light emitting diode according to further embodiments.
Figure 3B:
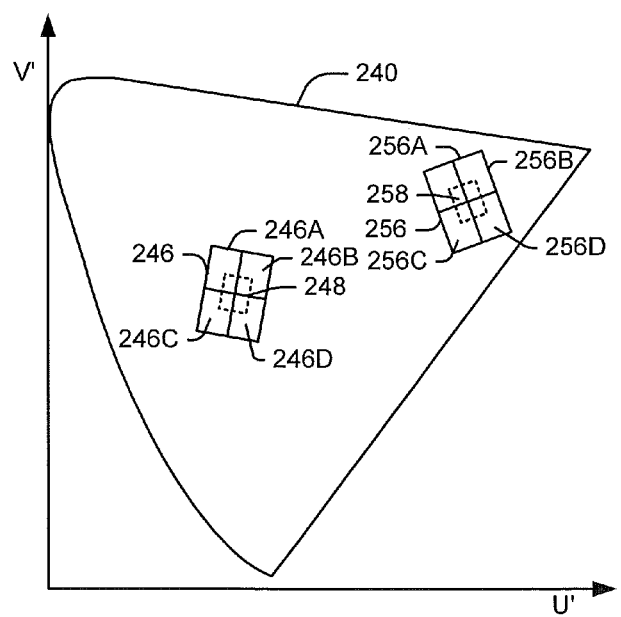
FIG. 3B is a chromaticity diagram illustrating a plurality of chromaticity regions corresponding to different groups of light emitters having similar chromaticity coordinates according to some embodiments.

Referring to FIG. 3A, an LED package 200 that includes multiple groups of multiple light emitters is illustrated. For example, the LED package 211 includes a first group of 24 white or near-white light emitters 220 and a second group of eight red light emitters 230 for a total of 32 light emitters. Light emitters in each group of light emitters may be selected in accordance with embodiments of the invention. For example, an LED package 200 may include a plurality of "white" LED chips 220 comprising phosphor-coated blue emitting LED chips and a plurality of red light emitting LED chips 230. As used herein, "red light" refers to visible light having a dominant wavelength of about 600 nm or more. Referring to FIG. 3B, the white LED chips 220 may be selected from a plurality of subregions 246A-246D that are defined in a chromaticity region 246 within a chromaticity space 240 that includes a first target chromaticity region 248 for combined light emitted by the white light emitters. Furthermore, the red light emitters 230 may be selected from a plurality of subregions 256A-256D that are defined in a chromaticity region 256 that includes a second target chromaticity region 258 of combined light emitted by the red light emitters 230. As the combined light emitted by the white light emitters falls within the first target chromaticity region 248 and the combined light emitted by the red light emitters 230 falls within the second target chromaticity region 258, the color of the total combined light emitted by the LED package 200 may be more consistent overall.

It will be appreciated that the chromaticity regions 246, 256 shown in FIG. 3B may be in any desired location within the chromaticity space 240 and may have any desired size or shape. The size, shape and location of the chromaticity regions 246, 256 in FIG. 3B are arbitrary and are shown for illustrative purposes only.

Figure 4A:
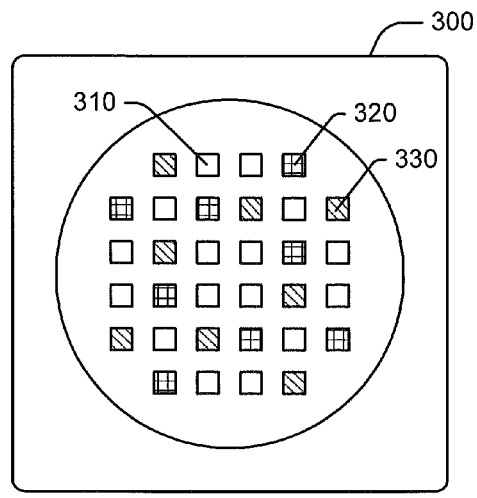
FIG. 4A is a plan view of a packaged light emitting diode according to further embodiments.
Figure 4B:
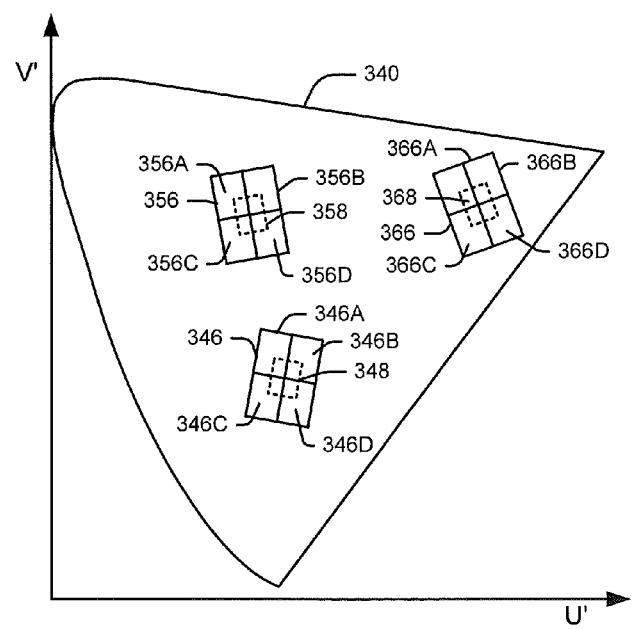
FIG. 4B is a chromaticity diagram illustrating a plurality of chromaticity regions corresponding to different groups of light emitters having similar chromaticity coordinates according to some embodiments.

As a further example, referring to FIGS. 4A and 4B, an LED package 300 may include a plurality of "white" LED chips 310 comprising phosphor-coated blue emitting LED chips, a plurality of yellow-green LED chips 320 comprising phosphor-coated blue emitting LED chips and a plurality of red emitting LED chips 330. The white LED chips 310 may be selected from a plurality of subregions 346A-346D that are defined in a chromaticity region 346 within a chromaticity space 340 that includes a target chromaticity region 348 of combined light emitted by the white light emitters 310. The yellow-green LED chips 320 may be selected from a plurality of subregions 356A-356D that are defined in a chromaticity region 356 of the chromaticity space 340 that includes a target chromaticity region 358 of combined light emitted by the yellow-green light emitters. The red LED chips 330 may be selected from a plurality of subregions 366A-366D that are defined in a chromaticity region 366 of the chromaticity space 340 that includes a target chromaticity region 368 of combined light emitted by the red light emitters 330. The respective combined colors of the white, yellow-green and red light emitters may fall within the target chromaticity regions 348, 358. 368. Accordingly, the color of combined light emitted by the LED package 300 may be more consistent.

It will be appreciated that the chromaticity regions 346, 356 and 366 shown in FIG. 4B may be in any desired location within the chromaticity space 340 and may have any desired size or shape. The size, shape and location of the chromaticity regions 346, 356, 366 in FIG. 4B are arbitrary and are shown for illustrative purposes only.

Figure 5:
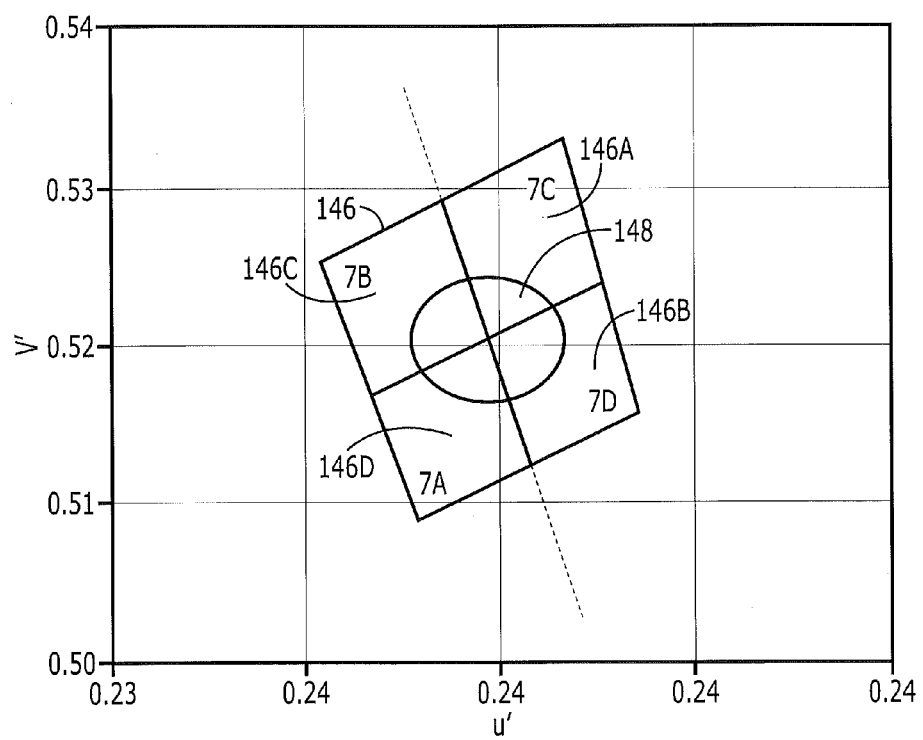
FIG. 5 is a chromaticity diagram including a chromaticity region that is subdivided into chromaticity subregions according to some embodiments.

Referring to FIG. 5, a target chromaticity region 148 can be defined as a region that is within and encompassed by a chromaticity region 146 that is defined in the proposed ANSI standard C78.377A for chromaticity of solid state light emitting devices. For example, in some embodiments, the chromaticity region 146 may encompass a point on the black body locus (BBL) having a color temperature of about 3050K. While FIG. 5 illustrates a chromaticity region 146 as represented on a 1976 CIE u'v' chromaticity diagram, the chromaticity region 146 may correspond to a region encompassing a point on the BBL of a 1931 CIE x,y chromaticity diagram. In some embodiments, the chromaticity region 146 may be bounded by a quadrilateral defined by points having the following (x,y) coordinates on a 1931 CIE chromaticity x,y diagram: A (0.4147,0.3814); B (0.4299,0.4165); C (0.4562, 0.4260); D (0.4373,0.3893).

Figure 6A:
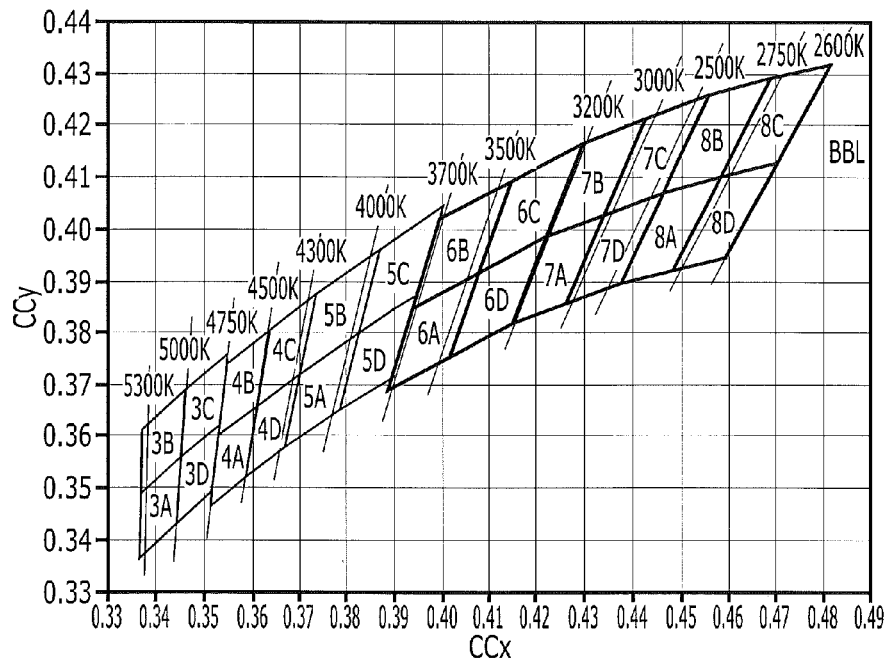
FIG. 6A illustrates standard chromaticity regions, or bins, on a chromaticity diagram.

A plurality of possible chromaticity regions, as represented on 1931 CIE chromaticity diagrams, are illustrated in FIG. 6A, on which emitter group regions 3A-3D, 4A-4D, 5A-5D, 6A-6D and 7A-7D are shown. Numeric definitions of the (x,y) coordinates of these emitter group regions are shown in the following Table:

TABLE 1

Emitter Group Regions 3A-3D to 8A-8D

| Region | x | y | Region | x | y | Region | x | y | Region | x | y |
|---|---|---|---|---|---|---|---|---|---|---|---|
| 3A | 0.3371 | 0.3490 | 3B | 0.3376 | 0.3616 | 3C | 0.3463 | 0.3687 | 3D | 0.3451 | 0.3554 |
|  | 0.3451 | 0.3554 |  | 0.3463 | 0.3687 |  | 0.3551 | 0.3760 |  | 0.3533 | 0.3620 |
|  | 0.3440 | 0.3428 |  | 0.3451 | 0.3554 |  | 0.3533 | 0.3620 |  | 0.3515 | 0.3487 |
|  | 0.3366 | 0.3369 |  | 0.3371 | 0.3490 |  | 0.3451 | 0.3554 |  | 0.3440 | 0.3428 |
| 4A | 0.3512 | 0.3465 | 4B | 0.3529 | 0.3597 | 4C | 0.3615 | 0.3659 | 4D | 0.3590 | 0.3521 |
|  | 0.3529 | 0.3597 |  | 0.3548 | 0.3736 |  | 0.3641 | 0.3804 |  | 0.3615 | 0.3659 |
|  | 0.3615 | 0.3659 |  | 0.3641 | 0.3804 |  | 0.3736 | 0.3874 |  | 0.3702 | 0.3722 |
|  | 0.3590 | 0.3521 |  | 0.3615 | 0.3659 |  | 0.3702 | 0.3722 |  | 0.3670 | 0.3578 |
| 5A | 0.3670 | 0.3578 | 5B | 0.3702 | 0.3722 | 5C | 0.3825 | 0.3798 | 5D | 0.3783 | 0.3646 |
|  | 0.3702 | 0.3722 |  | 0.3736 | 0.3874 |  | 0.3869 | 0.3958 |  | 0.3825 | 0.3798 |
|  | 0.3825 | 0.3798 |  | 0.3869 | 0.3958 |  | 0.4006 | 0.4044 |  | 0.3950 | 0.3875 |
|  | 0.3783 | 0.3646 |  | 0.3825 | 0.3798 |  | 0.3950 | 0.3875 |  | 0.3898 | 0.3716 |
| 6A | 0.3889 | 0.3690 | 6B | 0.3941 | 0.3848 | 6C | 0.4080 | 0.3916 | 6D | 0.4017 | 0.3751 |
|  | 0.3941 | 0.3848 |  | 0.3996 | 0.4015 |  | 0.4146 | 0.4089 |  | 0.4080 | 0.3916 |
|  | 0.4080 | 0.3916 |  | 0.4146 | 0.4089 |  | 0.4299 | 0.4165 |  | 0.4221 | 0.3984 |
|  | 0.4017 | 0.3751 |  | 0.4080 | 0.3916 |  | 0.4221 | 0.3984 |  | 0.4147 | 0.3814 |
| 7A | 0.4147 | 0.3814 | 7B | 0.4221 | 0.3984 | 7C | 0.4342 | 0.4028 | 7D | 0.4259 | 0.3853 |
|  | 0.4221 | 0.3984 |  | 0.4299 | 0.4165 |  | 0.4430 | 0.4212 |  | 0.4342 | 0.4028 |
|  | 0.4342 | 0.4028 |  | 0.4430 | 0.4212 |  | 0.4562 | 0.4260 |  | 0.4465 | 0.4071 |
|  | 0.4259 | 0.3583 |  | 0.4342 | 0.4028 |  | 0.4465 | 0.4071 |  | 0.4373 | 0.3893 |
| 8A | 0.4373 | 0.3893 | 8B | 0.4465 | 0.4071 | 8C | 0.4582 | 0.4099 | 8D | 0.4483 | 0.3919 |
|  | 0.4465 | 0.4071 |  | 0.4562 | 0.4260 |  | 0.4687 | 0.4289 |  | 0.4582 | 0.4099 |

TABLE 1-continued

Emitter Group Regions 3A-3D to 8A-8D

| Region | x | y | Region | x | y | Region | x | y | Region | x | y |
|---|---|---|---|---|---|---|---|---|---|---|---|
| | 0.4582 | 0.4099 | | 0.4687 | 0.4289 | | 0.4813 | 0.4319 | | 0.4700 | 0.4126 |
| | 0.4483 | 0.3919 | | 0.4582 | 0.4099 | | 0.4700 | 0.4126 | | 0.4593 | 0.3944 |

According to some embodiments, a desired emitter group region may be defined by a standard, such as the ANSI C78.377A LED binning standard, Table A1 of which is reproduced below:

TABLE 2

ANSI C78.377A Table A1

| | 2700 K | | 3000 K | | 3500 K | | 4000 K | |
|---|---|---|---|---|---|---|---|---|
| | x | y | x | y | x | y | x | y |
| Center point | 0.4578 | 0.4101 | 0.4338 | 0.4030 | 0.4073 | 0.3917 | 0.3818 | 0.3787 |
| Tolerance | 0.4813 | 0.4319 | 0.4562 | 0.4260 | 0.4299 | 0.4165 | 0.4006 | 0.4044 |
| Quadrangle | 0.4562 | 0.4260 | 0.4299 | 0.4165 | 0.3996 | 0.4015 | 0.3736 | 0.3874 |
| | 0.4373 | 0.3893 | 0.4147 | 0.3814 | 0.3889 | 0.3690 | 0.3670 | 0.3578 |
| | 0.4593 | 0.3944 | 0.4373 | 0.3893 | 0.4147 | 0.3814 | 0.3898 | 0.3716 |
| | 4500 K | | 5000 K | | 5700 K | | 6500 K | |
| | x | y | x | y | x | y | x | y |
| Center point | 0.3611 | 0.3658 | 0.3447 | 0.3553 | 0.3287 | 0.3417 | 0.3123 | 0.3282 |
| Tolerance | 0.3736 | 0.3874 | 0.3551 | 0.3760 | 0.3376 | 0.3616 | 0.3205 | 0.3481 |
| Quadrangle | 0.3548 | 0.3736 | 0.3376 | 0.3616 | 0.3207 | 0.3462 | 0.3028 | 0.3304 |
| | 0.3512 | 0.3465 | 0.3366 | 0.3369 | 0.3222 | 0.3243 | 0.3068 | 0.3113 |
| | 0.3670 | 0.3578 | 0.3515 | 0.3487 | 0.3366 | 0.3369 | 0.3221 | 0.3261 |

Conventionally, to ensure that combined light emitted by a package falls within a standard chromaticity region, or bin, only light emitters that fall within the standard bin are chosen for inclusion within the package, and other light emitters that do not fall within the standard bin are discarded or ignored. However, some embodiments enable the selection and use of light emitters having chromaticity points that fall outside a standard bin to be used in a package that emits combined light having a chromaticity point within the standard bin, and in some cases, within a chromaticity region that is even smaller than the standard bin. As used herein, a "bin" refers to a defined region of a chromaticity space. Typically, LEDs are sorted into defined bins for manufacturing purposes based on the chromaticity of light emitted by the LEDs, in a process referred to as "binning." In the ANSI C78.377A standard, bins are defined as quadrangles that inscribe a 7-step MacAdam ellipse. That is, the quadrangles have widths about the same as a major axis of a 7-step MacAdam ellipse centered within the quadrangle, which is the standard tolerance defined for compact fluorescent lamps by the Department of Energy Energy Star program. However, because the bins are defined as quadrangles, some chromaticity points that fall within the bin may nevertheless fall outside the 7 step MacAdam ellipse used to define the bin. Thus, in packaging methods in which light emitters are simply selected from a desired bin, some packaged LEDs can emit light that falls within the defined bin that has a visibly different color from other packaged LEDs that also emit light that falls within the bin. It will be appreciated that bins can be defined as shapes other than quadrangles. For example, bins could be defined as ellipses such as MacAdam ellipses, triangles, circles or any other geometric shape. Furthermore, bins can be defined in any color space, including a 1931 CIE (x,y) color space, a 1976 CIE (u',v') color space, or any other color space.

Figure 6B:
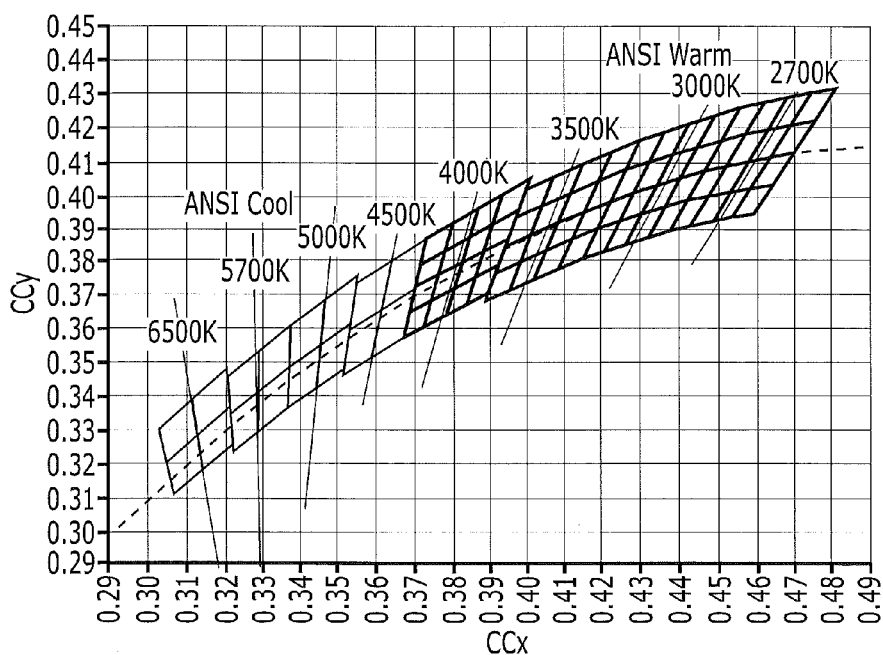
FIG. 6B illustrates standard chromaticity bins on a chromaticity diagram that have been further subdivided into smaller bins.

In some embodiments, the standard bins can be further subdivided into even smaller bins that can be used to define chromaticities. For example, FIG. 6B illustrates standard chromaticity bins defined according to the ANSI C78.377A LED binning standard that have been further subdivided into smaller bins. Smaller bins offer improved color consistency among LED lighting fixtures. In some embodiments, 4 sub-bins may be defined within each ANSI quadrangle. In further embodiments, one or more of the warm/neutral ANSI quadrangles may be sub-divided into 16 discrete sub-bins, each of which may be 94 percent smaller than the quadrangles defined in the ANSI C78.377A LED binning standard. It will be appreciated, therefore, that the at least three sub-bins from which the LEDs are selected can be non-contiguous within the region.

Figure 7:
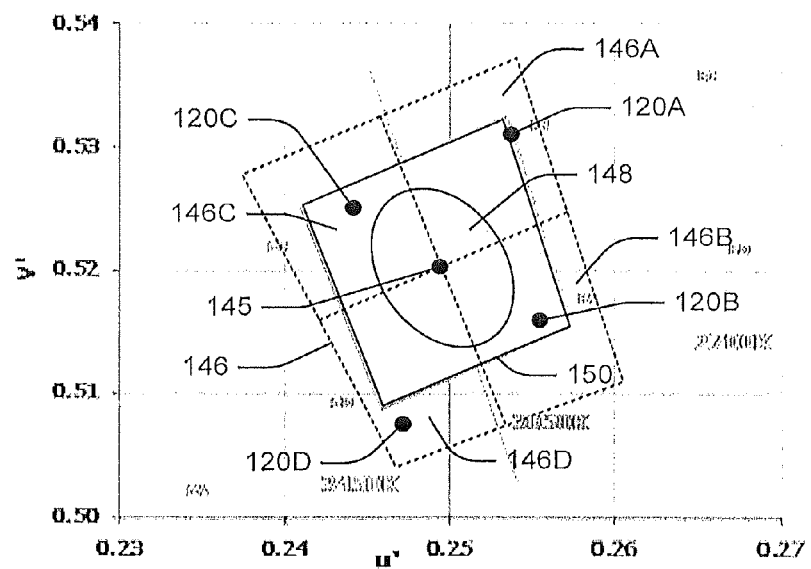
FIG. 7 illustrates a chromaticity region that is subdivided into subregions according to some embodiments.

Referring to FIG. 7, a standard bin 150 defined in the ANSI C78.377A LED binning standard is shown. According to some embodiments, a chromaticity region 146 is defined. The chromaticity region 146 may defined as contiguous with the defined bin 150 in some embodiments. In other embodiments, as illustrated in FIG. 7, the chromaticity region 146 may be larger than and encompass the defined bin 150, such that the defined bin 150 is a subset of the chromaticity region 146. Although the chromaticity region 146 illustrated in FIG. 7 is a quadrangle, it will be appreciated that other geometric shapes may be used to define the chromaticity region. The chromaticity region 146 is further subdivided into a plurality of subregions 146A-146D, each of which may at least partially overlap the standard bin 150. However, subregions may be defined that do not overlap the standard bin 150. Light emitters 120A-120D having chromaticities within one or more of the defined subregions 146A-146D may then be selected for inclusion in an LED package.

The light emitters 120A-120D may, for example, have respective chromaticity points at the points indicated in FIG. 7. In the example of FIG. 7, the chromaticity point of light emitter 120A is within the subregion 146A, but is on the edge of the defined bin 150. The chromaticity point of the light emitter 120B is within the subregion 146B and within the desired bin 150. Similarly, the chromaticity point of the light emitter 120C is within the subregion 146C and within the desired bin 150. The chromaticity point of light emitter 120D is within the subregion 146D, but is outside the desired bin 150. However, the combined light emitted by all four light emitters 120A-120D may be within the desired bin 150, and may be within an even smaller target chromaticity region 148 that is within the defined bin 150.

In particular, for a chromaticity region 146 that is defined contiguous with an ANSI-specified bin, a target chromaticity region 148 can be obtained according to some embodiments that approximates a 4-step MacAdam ellipse, thereby providing significantly better color purity compared to a package that is simply specified as falling within the ANSI-specified bin. A 4-step MacAdam ellipse provides approximately the level color purity that is available from standard T8, T10 and T12 fluorescent lamps.

In some embodiments, a target chromaticity region 148 can be obtained that is approximately the size of a 2-step MacAdam ellipse through appropriate selection of light emitters. A 2-step MacAdam ellipse provides approximately the level color purity that is available from standard halogen and incandescent lamps. In further embodiments, a target chromaticity region 148 can be obtained that is even smaller than a 2-step MacAdam ellipse.

In some embodiments, a chromaticity region is defined that encompasses a defined bin. The chromaticity region is divided into subregions, each of which at least partially overlaps the defined bin. Light emitters are selected from the subregions for inclusion within an LED package. For each of the defined subregions, there may be a complementary subregion that is arranged opposite a center point of the defined bin from the subregion. For example, referring to FIG. 7, subregions 146A and 146D are complementary subregions, since they are disposed opposite one another relative to a center point 145 of the defined bin 150, and subregions 146C and 146B are complementary subregions. In selecting light emitters for inclusion in an LED package 100, whenever a light emitter is selected from a subregion, a light emitter may also be selected from a complementary subregion for inclusion within a particular LED package 100.

By selecting light emitters from multiple defined subregions within a chromaticity region, the final combined light output by a packaged LED 100 may be more consistent (i.e. more tightly grouped) than if the light emitters had simply been selected from an arbitrary point within the chromaticity region. In some embodiments, it has been found that an improvement in grouping of combined light chromaticities of up to 79% or more can be achieved.

Figure 8A:
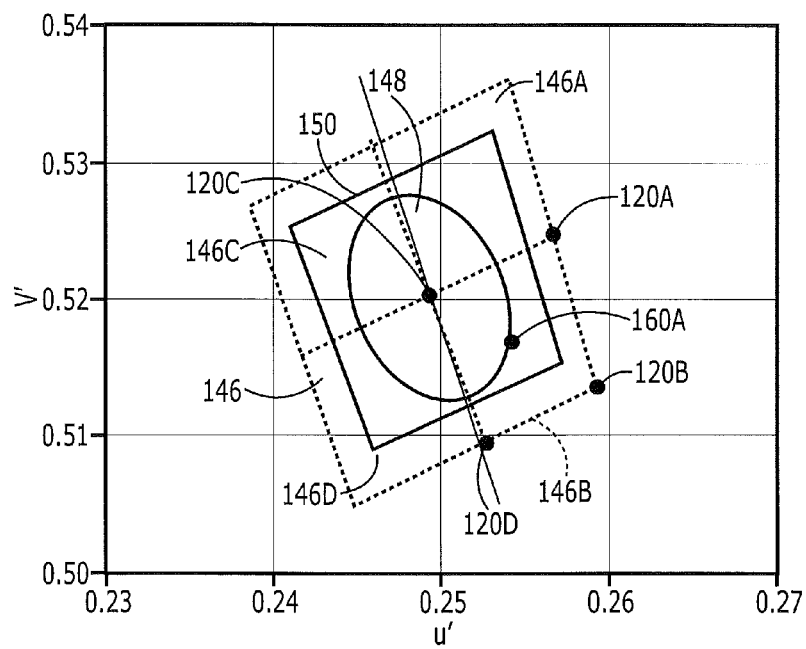
FIGS. 8A, 8B and 8C illustrate selection of light emitters from chromaticity regions that are subdivided into subregions according to some embodiments.

In general, the target chromaticity region 148 can be determined as the union of all possible chromaticity points of light that is generated by a combination of one light emitter from each of the subregions 146A-146D. Thus, the outer perimeter of the target chromaticity region 148 can be determined by combining light from four different light emitters at the extreme points of the respective subregions 146-146D. For example, referring to FIG. 8A, assuming equal luminous flux, light emitters 120A-120D having chromaticity points at the extreme positions shown therein will generate combined light having a chromaticity point 160A. That is, for a selection of one light emitter from each of the four defined subregions 146A to 146D, FIG. 8A represents a worst-case or most extreme scenario of chromaticity points for the four light emitters. However, as illustrated in FIG. 8A, the chromaticity point 160A of the combined light may still fall well within the defined bin 150

Figure 8B:
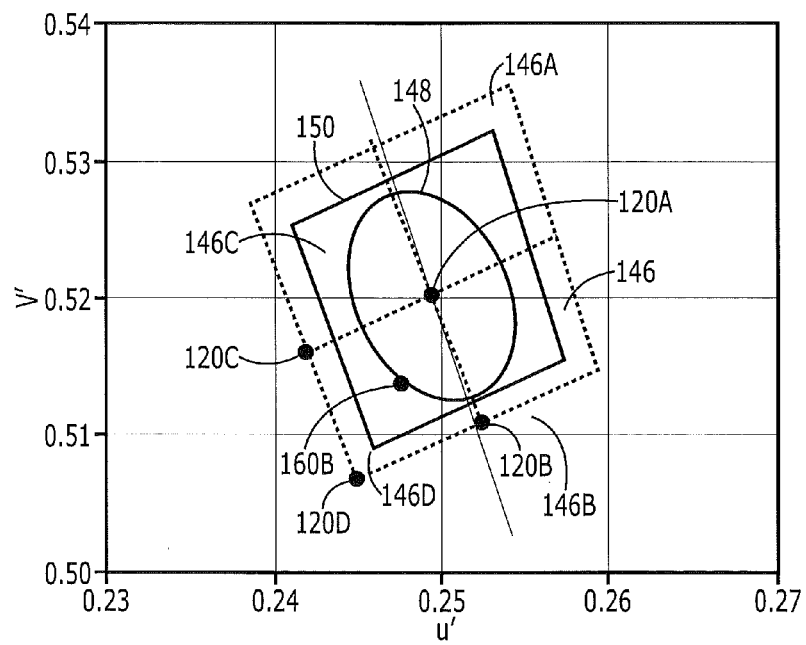

Similarly, referring to FIG. 8B, assuming equal luminous flux, light emitters 120A-120D having chromaticity points at the extreme positions shown therein will generate combined light having a chromaticity point 160B, which is still within the defined bin 150. Taking all possible combinations of four light emitters from the four different subregions 146A to 146D will define the target chromaticity region 148 as a region of all possible chromaticity points of combined light that can be obtained from a combination of light emitters including one light emitter from each of the subregions 146A-146D.

Figure 8C:
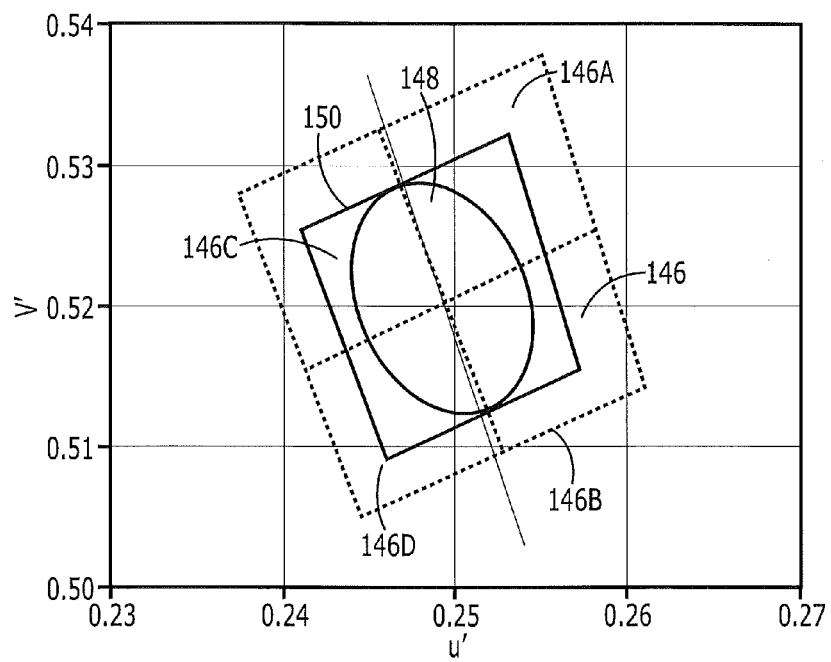

In some particular embodiments, the size of the chromaticity region 146, which can be used to define the bins 146A-146D from which light emitters are selected, can be determined so that any combination of light emitters from the four different subregions 146A-146D will not generate combined light having a chromaticity point that falls outside the defined bin 150. That is, the size of the chromaticity region 146 can be selected so that the target chromaticity region 148 touches an edge of the defined bin 150, as illustrated in FIG. 8C.

Thus, according to some embodiments, an LED package 100 can generate combined light having a chromaticity that is inside a desired bin even though the package 100 includes one or more light emitters having chromaticities outside the desired bin. This approach can provide significant flexibility to an LED package manufacturer, because it enables the use of larger bins of light emitters than was previously possible. This can reduce waste and inefficiency in the packaging process, because there may be fewer unusable parts compared to a manufacturing process in which only light emitters from a defined bin are selected for inclusion in a package designed to emit light having a color point within the region occupied by the defined bin.

Figure 9:
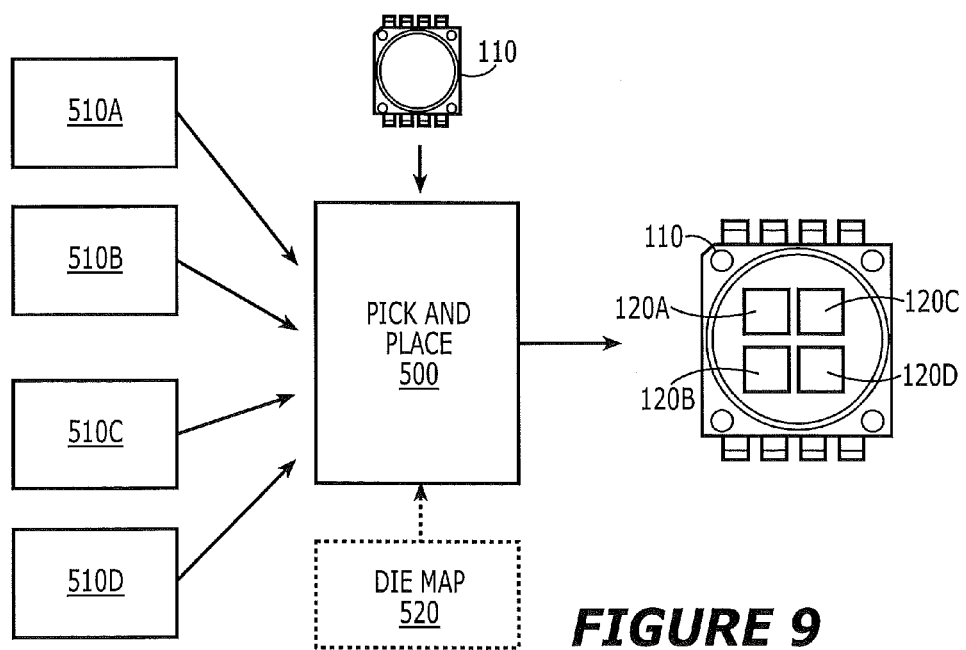
FIG. 9 schematically illustrates a system for assembling light emitting diode packages according to some embodiments.

A system for assembling LED packages according to some embodiments is illustrated in FIG. 9. As shown therein, a pick and place device 500 is configured to accept a plurality of die sheets 510A to 510D. Each of the die sheets 510A to 510D includes light emitters 120A to 120D that emit light that falls within one of the subregions 146A to 146D of the chromaticity region 146. For example, light emitters 120A on the die sheet 510A may emit light that falls within the first subregion 146A of the chromaticity region 146, light emitters 120B on the die sheet 510B may emit light that falls within the second subregion 146B of the chromaticity region 146, etc.

In some embodiments, the pick and place device 500 may accept a single die sheet 510A that includes light emitters from each of the subregions 146A-146D along with an electronic die map 520 containing information about the chromaticities of the various die on the die sheet 510A.

In some embodiments, one or more of the die sheets 510A-510D may contain light emitters that include LED die that have been coated with a phosphor containing material.

The pick and place device 500 also receives a plurality of package bodies 110, for example on a tape reel. The pick and place device 500 may select one light emitter 120A-120D from each of the die sheets 510A-510D and mount it on a single package body 110. The package body 110 including the four light emitters 120A-120D is then output by the pick and place device 500 to a subsequent processing device, for example, to coat the light emitters 120A-120D with an encapsulant, to affix a lens onto the package body 110, or to perform some other action.

Accordingly, a manufacturing process according to some embodiments can facilitate efficient assembly of an LED package 100 that includes light emitters selected to generate a combined light that falls within a target chromaticity region.

In addition to chromaticity, luminous flux may be considered in grouping the light emitters 120. For example, reference is now made to FIG. 10, which is a table illustrating luminous flux bin values according to some embodiments of the present invention. The light emitters 120 may be grouped according to their luminous flux using multiple luminous flux ranges. For example, three luminous flux bins identified as V1, V2, and V3 may correspond to ranges 100 lm to 110 lm, 110 lm to 120 lm, and 120 lm to 130 lm, respectively. In this manner, emitter groups may be defined as falling within a specific chromaticity subregion at a specific luminous flux range. For example, an emitter group may include all light emitters 120 having chromaticity corresponding to chromaticity subregion 146C and luminous flux V2. Thus, the light emitters 120 may be grouped responsive to a combined chromaticity of a portion of multiple bins that may be defined corresponding to multiple chromaticity regions and multiple luminous flux ranges.

Figures 10, 11:
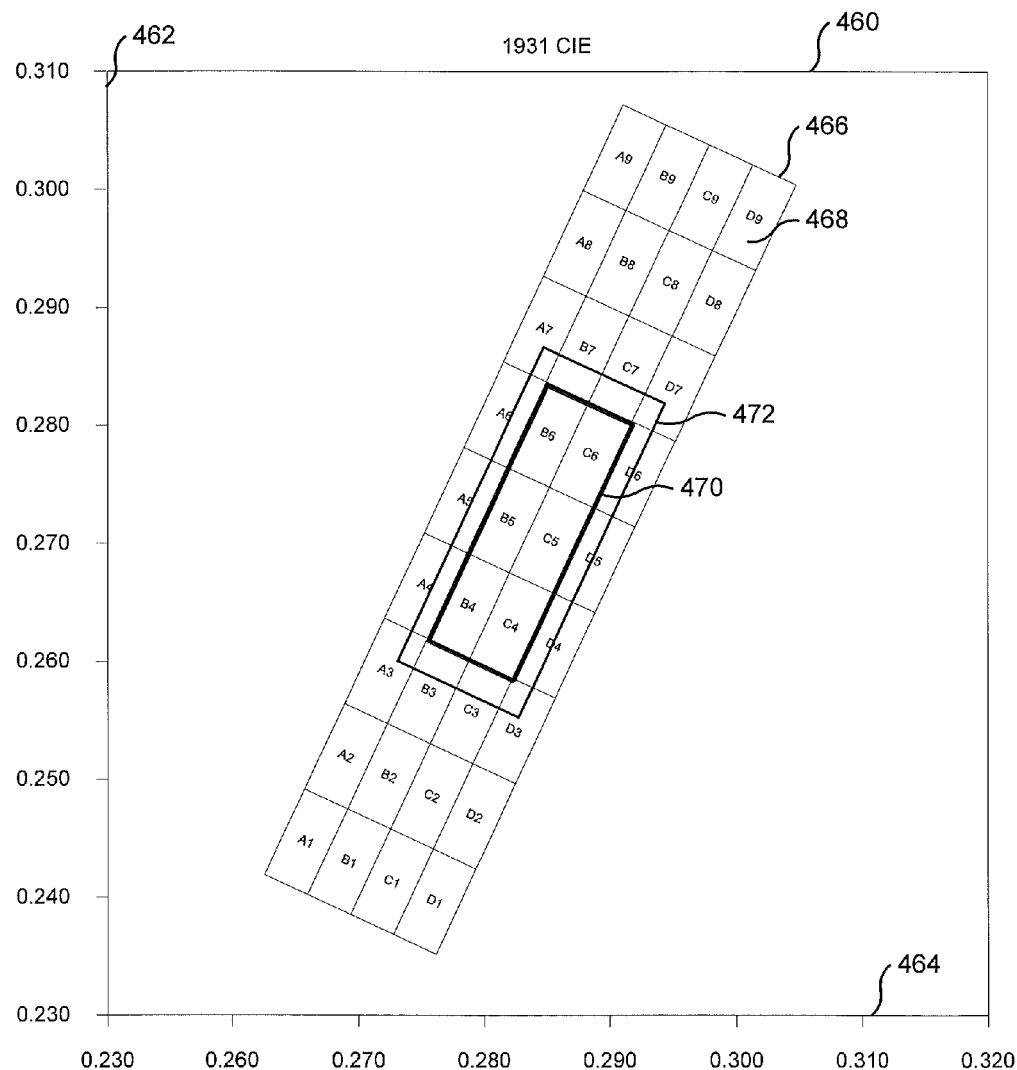
FIG. 10 illustrates luminous flux bins that can be used in accordance with some embodiments.
FIG. 11 illustrates a portion of a chromaticity space including a plurality of chromaticity regions including a target chromaticity region according to some embodiments.

Reference is now made to FIG. 11, which is a chromaticity diagram illustrating multiple chromaticity regions and a target chromaticity region according to some embodiments of the present invention. A portion of 1931 CIE chromaticity space 460 includes an x axis 464 and a y axis 462. Light emitters 120 may be sorted into multiple chromaticity subregions 468 according to the chromaticity of light emitted therefrom. In some embodiments, the chromaticity regions 468 may fall within a region that is generally considered to constitute white light. A target chromaticity region 470 may include a portion of the chromaticity region 460 that is specified corresponding to a design specification and/or a particular application. In some embodiments, the target chromaticity region 470 may be expressed in terms of chromaticity coordinates. In some embodiments, a tolerance color region 472 may be larger than the target chromaticity region 470 due to variations between individual emitters within each of the subregions 468.

In some embodiments, each of the emitter group regions 468 may include a center point that may be determined as a function of chromaticity values. Some embodiments provide that, within each bin, the emitters may be further grouped corresponding to luminous flux. In this regard, each of the bins may be expressed, for example, in terms of x, y, and Y, such that chromaticity of each of the bins may be expressed as center point x, y coordinates and the luminous flux may be expressed as Y.

A combined chromaticity corresponding to emitters from two bins may be determined using the chromaticity and luminous flux center point values corresponding to the two bins. For example, the combined chromaticity component values for mixing two bins, bin 1 and bin 2, may be calculated as:

$$x = \frac{x1*m1 + x2*m2}{m1 + m2}; \text{ and} \qquad (1)$$
$$y = \frac{y1*m1 + y2*m2}{m1 + m2},$$

such that x1 and y1 are chromaticity center point values of bin 1, and x2 and y2 and chromaticity center point values of bin 2. Intermediate values m1 and m2 may be used to incorporate the center point luminous flux values Y1 and Y2 of bins 1 and 2, respectively, into the combined chromaticity component values and may be determined as:

$$m1 = \frac{Y1}{y1}; \text{ and} \qquad (2)$$
$$m2 = \frac{Y2}{y2}.$$

In some embodiments, a combined luminous flux corresponding to the combination of bins 1 and 2 may be determined as:

$$Y = Y1 + Y2. \qquad (3)$$

In some embodiments, combinations that produce a luminous flux below a specified range may be discarded. In some embodiments, the luminous flux values of the bins are such that a combined luminous flux is necessarily within a specified range. For example, if the minimum bin luminous flux is V1 and the specified range includes V1 luminosities, then all of the combinations necessarily are within the specified range. Although the disclosure herein specifically addresses two bin combinations, the invention is not thus limited. For example, combinations including three or more bins may also be used according to the methods, devices and apparatus disclosed herein.

After filtering out combinations based on luminous flux, if necessary, the combined chromaticity of each two-bin combination may be compared to a target chromaticity region 470 to determine which of the combinations to discard. For example, if a combined chromaticity is located in emitter group region A3 then that combination may be discarded. In this manner, the combinations that provide sufficient luminous flux and chromaticity may be considered when selecting the light emitters 120 from corresponding ones of those bins.

In some embodiments, the multiple bins may be prioritized based on, for example, proximity to the target chromaticity region 470. For example, bins that are farther from the desired color region may be assigned a higher priority than bins that are nearer to the desired color region. In this manner, subregion A9 may be assigned a higher priority than subregion C3. In some embodiments, combination center points may then be prioritized corresponding to the bin priorities.

Some embodiments provide that the combination center points may be prioritized based on locations of the combination center points relative to a target chromaticity point in the target chromaticity region 470. In some embodiments, the target chromaticity may be dependent on the geometry of desired color region, such as, for example, a center and/or other focus point of the target chromaticity region 470. In some embodiments, the light emitters 120 are selected from a batch or inventory of light emitters that are grouped into the bins and the target chromaticity point may correlate to chromaticity and/or luminous flux data of the emitter inventory.

Selection and combination of light emitting devices may be performed according to the methods described in U.S. patent application Ser. No. 12/057,748, filed Mar. 28, 2008, the disclosure of which is incorporated herein as if fully set forth in its entirety.

Figure 12:
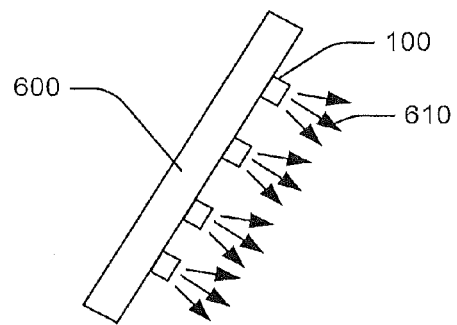
FIG. 12 illustrates a lighting panel for general illumination including a plurality of light emitting device packages according to some embodiments.

Referring to FIG. 12, a lighting panel 600 includes a plurality of LED packages 100 as described herein that are mounted on a first side of the panel 600 and that emit light combined 610 having a chromaticity within a target chromaticity region for use in general lighting applications.

Figure 13:
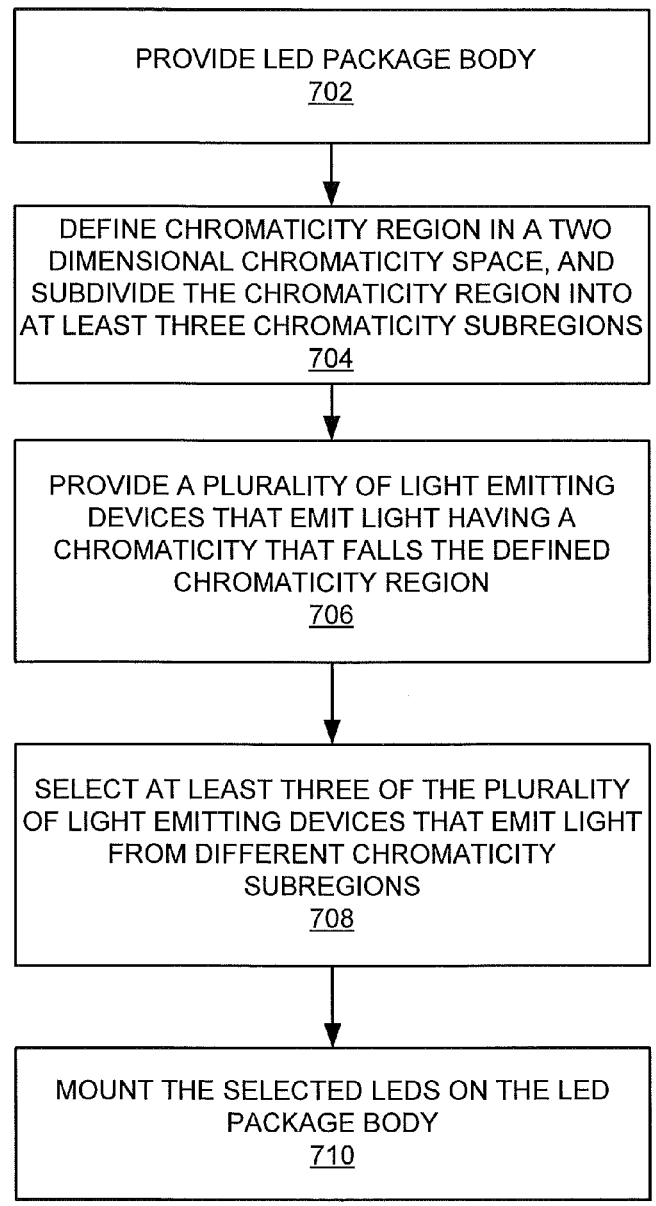
FIG. 13 is a flowchart illustrating operations of systems and/or methods according to some embodiments.

FIG. 13 is a flowchart illustrating operations according to some embodiments. As illustrated therein (with further reference to FIG. 7), methods of forming a light emitting device package assembly according to some embodiments include providing a light emitting device package body (Block 702), defining a chromaticity region in a two dimensional chromaticity space and subdividing the defined chromaticity region into at least three chromaticity subregions (Block 704), and providing a plurality of light emitting devices that emit light having a chromaticity that falls within the defined chromaticity region (Block 706). At least three of the plurality of light emitting devices are selected for mounting on the light emitting device package body, wherein each of the three light emitting devices emits light from a different one of the chromaticity subregions (Block 708). Finally, the selected LEDs are mounted on the package body (Block 710)

The methods may further include defining a second chromaticity region in a two dimensional chromaticity space and subdividing the second chromaticity region into at least three second chromaticity subregions, providing a second plurality of light emitting devices that emit light having a chromaticity that falls within at least one of the second chromaticity subregions, and, selecting at least three of the second plurality of light emitting devices, wherein each of the three light emitting devices of the second plurality of light emitting devices emits light from a different one of the second chromaticity subregions. The selected light emitting devices of the second plurality of light emitting devices are mounted on the light emitting device package body. Accordingly, the operations illustrated in Blocks 702 to 710 of FIG. 13 can be repeated and/or performed concurrently for a second or subsequent chromaticity regions.

As discussed above, the defined subregions may include a plurality of pairs of complementary subregions with respective subregions in a pair of complementary subregions arranged opposite a center point of the chromaticity region from one another. The methods may further include selecting at least four of the plurality of light emitting devices from at least four chromaticity subregions in pairs from respective pairs of complementary subregions.

As used herein, the term "complementary subregions" refers to two subregions arranged on opposite sides of a target chromaticity point, so that a line from at least one point in a first one of the complementary subregions to at least one point in a second one of the complementary subregions passes through the target chromaticity point. Three or more subregions are complementary if a polygon defined by the center points of the subregions encloses the target chromaticity point.

Similarly, two light emitting devices are complementary if a line through the chromaticity points of the two light emitters passes through a target chromaticity region, such as a 2-step, 4-step or 7-step MacAdam ellipse, around the target chromaticity point. Three or more light emitting devices are complementary if a polygon defined by the chromaticity points of the light emitting devices encloses the target chromaticity point.

Furthermore, the methods may include selecting a first light emitting device having a first luminous flux from a first subregion that has a center point that is located a first distance from a center point of the chromaticity region, and selecting a second light emitting device having a second luminous flux from a second subregion that is complementary to the first subregion and that has a center point that is located a second distance from a center point of the chromaticity region. The first distance may be smaller than the second distance and the first luminous flux may be larger than the second luminous flux, so that combined light emitted by the pair of light emitting device from complementary subregions may fall within the target chromaticity region, as illustrated in FIG. 11.

Referring again to FIG. 7, by selecting sets of light emitting devices that are complementary to one another in terms of chromaticity and luminous flux for inclusion in a device or system, a target chromaticity region 148 can be obtained that is even smaller than a 4-step MacAdam ellipse. For example, a target chromaticity region 148 can be obtained that is approximately the size of a 2-step MacAdam ellipse or smaller. For example, FIGS. 14A, 14B and 14C illustrate examples in which complementary light emitters are selected from a plurality of subregions within a defined region.

Figure 14A:
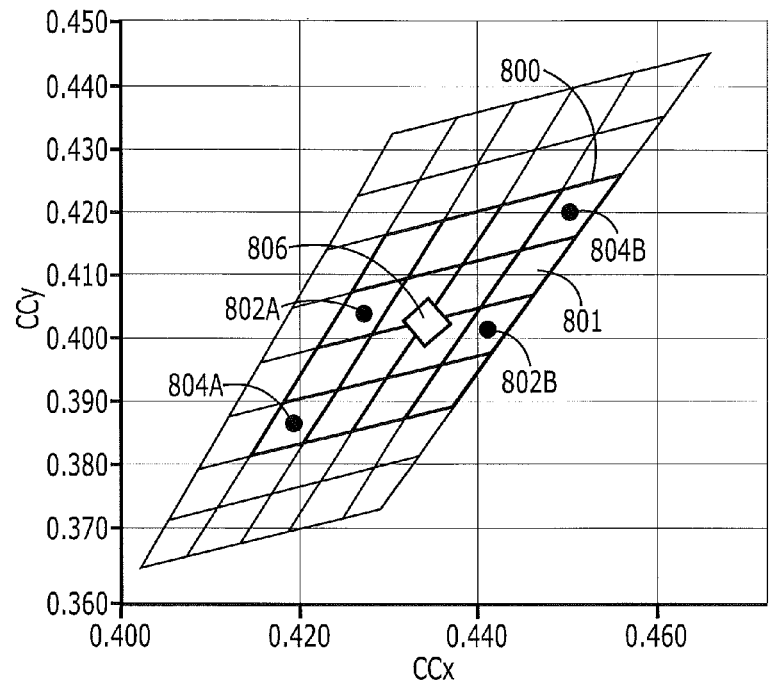
FIGS. 14A, 14B, 14C, 14D, 14E and 14F are simulation results that illustrate various combinations of sets of complementary light emitters according to some embodiments.
Figure 14B:
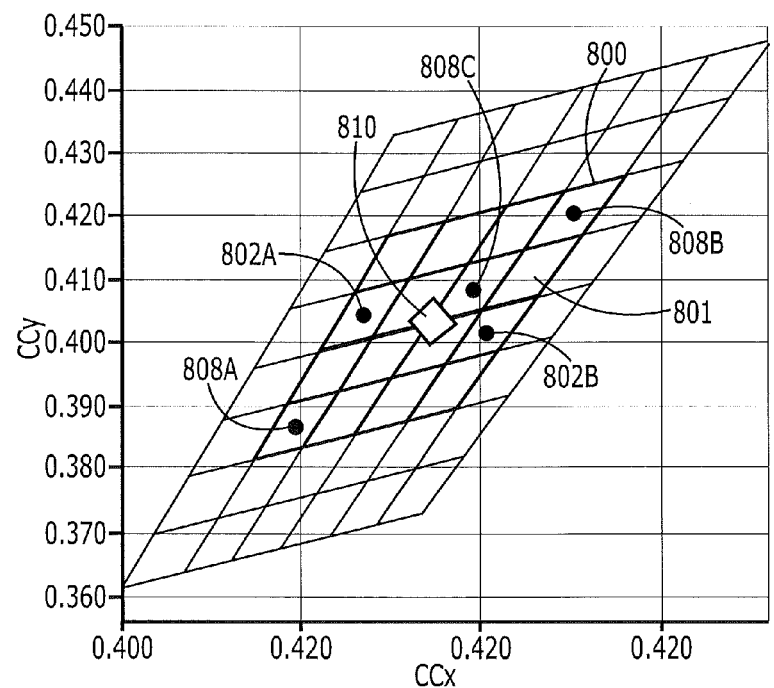
Figure 14C:
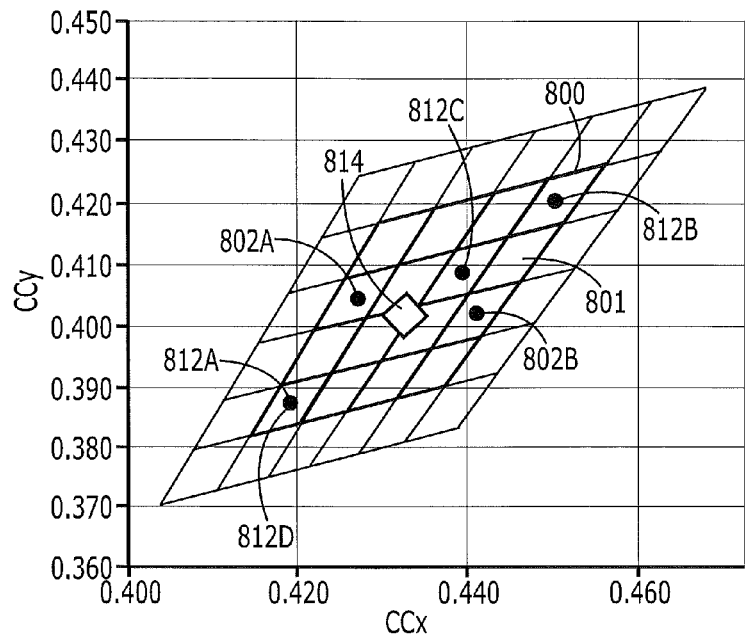

Referring to FIG. 14A, which illustrates a portion of a two-dimensional chromaticity space, a quadrangular chromaticity region 800 is defined that approximately corresponds to the 3000K bin defined in Table A1 of ANSI standard C78.377A. In FIG. 14A, the chromaticity region 800 has been subdivided into 16 approximately equal-sized quadrangular subregions 801.

The target chromaticity point is assumed to be the central point of the chromaticity region 800, which is at a (CCx, CCy) of (0.4342, 0.4028).

A first pair of complementary light emitters 802A, 802B having similar luminous flux ratings, and a second pair of complementary light emitters 804A, 804B having similar luminous flux ratings, may be selected from four different ones of the subregions 801 and combined in a package.

Using equation (3) above and assuming the light emitters 802A, 802B, 804A and 804B have luminous flux ratings and chromaticity points shown in Table 3 below, the combined light emitted by the packaged device may have a chromaticity point 806 at a (CCx, CCy) chromaticity point of (0.4337, 0.4021), which is near the target chromaticity point at the center of the chromaticity region 800.

TABLE 3

Chromaticity Points - Example 1

| Point | CCx | CCy | Flux |
|---|---|---|---|
| 802A | 0.427075 | 0.403975 | 93.9 lm |
| 802B | 0.441125 | 0.401525 | 93.9 lm |
| 804A | 0.419375 | 0.3866 | 93.9 lm |
| 804B | 0.4505 | 0.420025 | 93.9 lm |

A set of complementary light emitters may include more than two light emitters. For example, in the embodiments illustrated in FIG. 14B, a first complementary set of two light emitters 802A, 802B is provided as in the previous example, and a second set of three complementary light emitters 808A, 808B, and 808C is also provided.

Using equation (3) above and assuming the light emitters 802A, 802B, 808A, 808B and 808C have luminous flux ratings and chromaticity points shown in Table 4 below, the combined light emitted by the packaged device may have a chromaticity point 810 that is near the center of the quadrangle 800 at a (CCx, CCy) chromaticity point of (0.4348, 0.4033).

TABLE 4

Chromaticity Points - Example 2

| Point | CCx | CCy | Flux |
|---|---|---|---|
| 802A | 0.427075 | 0.403975 | 93.9 lm |
| 802B | 0.441125 | 0.401525 | 93.9 lm |
| 808A | 0.419375 | 0.3866 | 107 lm |

TABLE 4-continued

Chromaticity Points - Example 2

| Point | CCx | CCy | Flux |
|---|---|---|---|
| 808B | 0.4505 | 0.420025 | 93.9 lm |
| 808C | 0.439475 | 0.408425 | 93.9 lm |

As shown in FIG. 14B, the set of complementary light emitters 808A, 808B and 808C includes two lower-flux light emitters 808B, 808C on one side of the target chromaticity point and one higher flux light emitter 808A on an opposite side of the target chromaticity point. The presence of two lower flux light emitters 808B, 808C on one side of the target chromaticity point and one higher flux light emitter 808A on an opposite side of the target chromaticity point, but located relatively far from the target chromaticity point, helps to balance the color point of the combined devices near the target color point at the center of the chromaticity region 800.

Similarly, in the embodiments illustrated in FIG. 14C, a first complementary set of two light emitters 802A, 802B is provided as in the previous example, and a second set of four complementary light emitters 812A, 812B, 812C and 812D is also provided, with light emitters 812A and 812D having the same chromaticity point.

Using equation (3) above and assuming the light emitters 802A, 802B, 812A, 812B, 812C and 812D have luminous flux ratings and chromaticity points shown in Table 5 below, the combined light emitted by the packaged device may have a chromaticity point 816 that is near the center of the quadrangle 800 at a (CCx, CCy) chromaticity point of (0.4328, 0.4012).

TABLE 5

Chromaticity Points - Example 3

| Point | CCx | CCy | Flux |
|---|---|---|---|
| 802A | 0.427075 | 0.403975 | 93.9 lm |
| 802B | 0.441125 | 0.401525 | 93.9 lm |
| 812A | 0.419375 | 0.3866 | 93.9 lm |
| 812B | 0.4505 | 0.420025 | 100 lm |
| 812C | 0.439475 | 0.408425 | 107 lm |
| 812D | 0.419375 | 0.3866 | 93.9 lm |

As shown in FIG. 14C, the set of complementary light emitters 812A, 812B, 812C and 812D includes two lower-flux light emitters 812A, D on one side of the target chromaticity point and two higher flux light emitter 812B, 812C on an opposite side of the target chromaticity point. The presence of two lower flux light emitters 812A, 812D on one side of the target chromaticity point and two higher flux light emitter 812B, 812C on an opposite side of the target chromaticity point, with one higher flux light emitter 812C located relatively close to the target chromaticity point, helps to balance the color point of the combined devices near the target color point at the center of the chromaticity region 800.

Figure 14D:
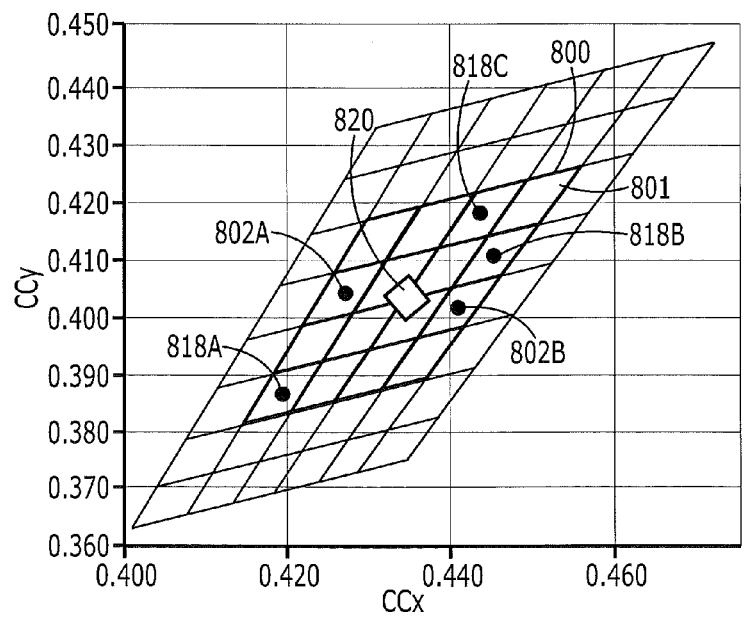

In the embodiments illustrated in FIG. 14D, a first complementary set of two light emitters 802A, 802B is provided as in the previous example, and a second set of three complementary light emitters 818A, 818B, and 818C is also provided.

Using equation (3) above and assuming the light emitters 802A, 802B, 818A, 818B and 818C have luminous flux ratings and chromaticity points shown in Table 6 below, the combined light emitted by the packaged device may have a chromaticity point 820 that is near the center of the quadrangle 800 at a (CCx, CCy) chromaticity point of (0.4348, 0.4033).

TABLE 6

Chromaticity Points - Example 4

| Point | CCx | CCy | Flux |
|---|---|---|---|
| 802A | 0.427075 | 0.403975 | 93.9 lm |
| 802B | 0.441125 | 0.401525 | 93.9 lm |
| 818A | 0.419375 | 0.3866 | 107 lm |
| 818B | 0.44575 | 0.410625 | 93.9 lm |
| 818C | 0.444 | 0.4177 | 93.9 lm |

As shown in FIG. 14D, the set of complementary light emitters 818A, 818B and 818C includes two lower-flux light emitters 818B, 818C on one side of the target chromaticity point and one higher flux light emitter 818A on an opposite side of the target chromaticity point. The presence of two lower flux light emitters 818B, 818C on one side of the target chromaticity point and one higher flux light emitter 818A on an opposite side of the target chromaticity point, but located relatively far from the target chromaticity point, helps to balance the color point of the combined devices near the target color point at the center of the chromaticity region 800.

Figure 14E:
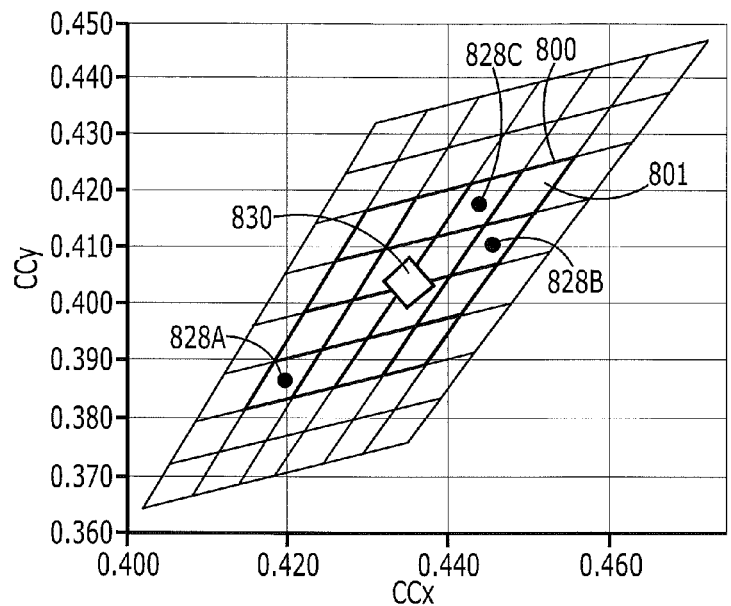

In the embodiments illustrated in FIG. 14E, a single set of three complementary light emitters 828A, 828B, and 828C is provided.

Using equation (3) above and assuming the light emitters 828A, 828B and 828C have luminous flux ratings and chromaticity points shown in Table 7 below, the combined light emitted by the packaged device may have a chromaticity point 830 that is near the center of the quadrangle 800 at a (CCx, CCy) chromaticity point of (0.4352, 0.4037).

TABLE 7

Chromaticity Points - Example 5

| Point | CCx | CCy | Flux |
|---|---|---|---|
| 828A | 0.419375 | 0.3866 | 107 lm |
| 828B | 0.44575 | 0.410625 | 93.9 lm |
| 828C | 0.444 | 0.4177 | 93.9 lm |

Figure 14F:
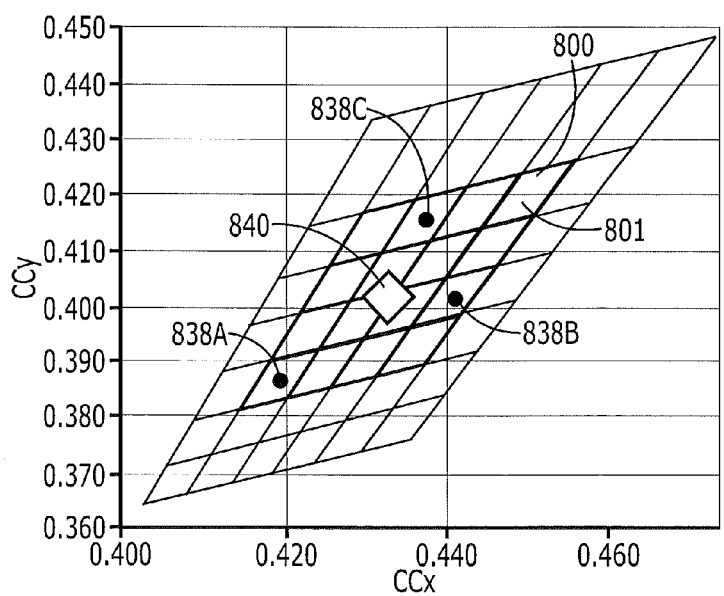
Figure 13:
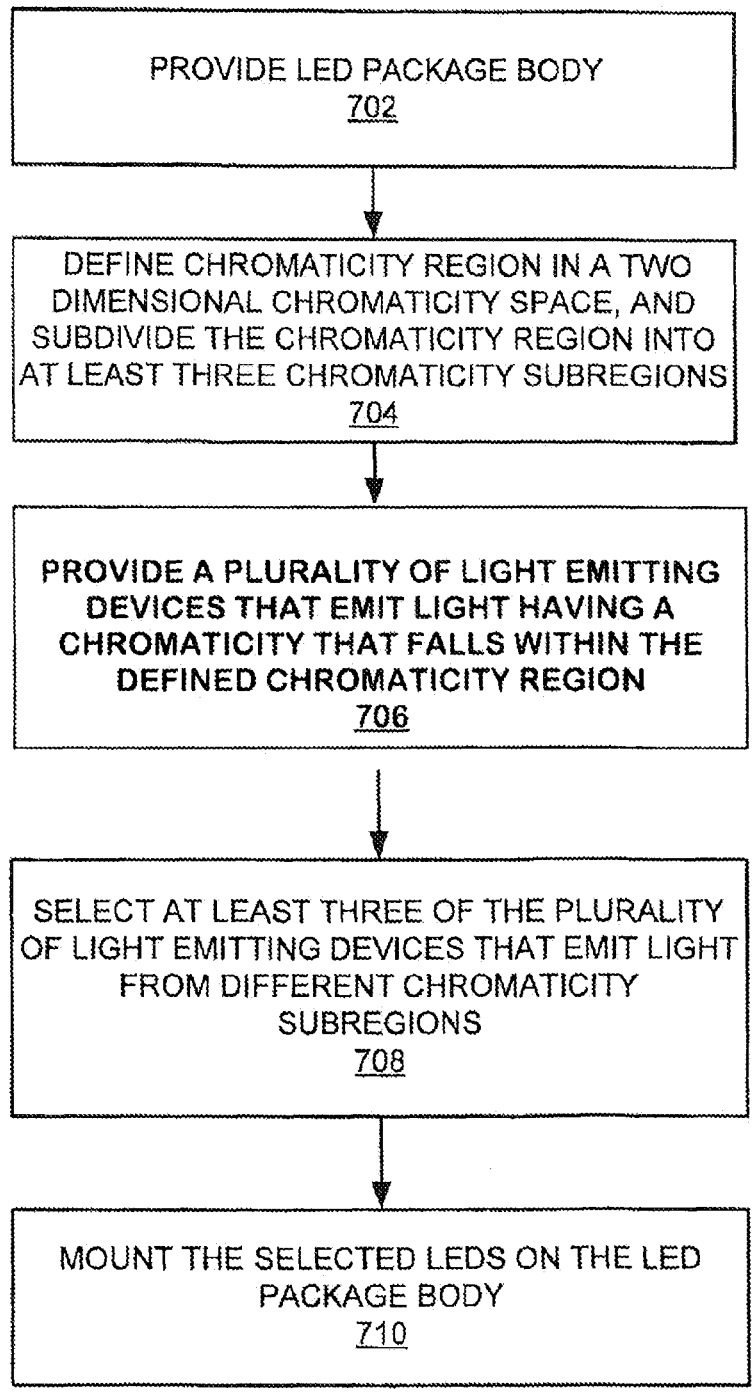

In the embodiments illustrated in FIG. 14F, a single set of three complementary light emitters 838A, 838B, and 838C is provided. The complementary light emitters 838A, 838B, and 838C are selected from subregions 81 that are complementary as a group, but that are not complementary in pairs.

Using equation (3) above and assuming the light emitters 838A, 838B and 838C have luminous flux ratings and chromaticity points shown in Table 8 below, the combined light emitted by the packaged device may have a chromaticity point 840 that is near the center of the quadrangle 800 at a (CCx, CCy) chromaticity point of (0.4330, 0.4015).

TABLE 8

Chromaticity Points - Example 6

| Point | CCx | CCy | Flux |
|---|---|---|---|
| 838A | 0.419375 | 0.3866 | 93.9 lm |
| 838B | 0.4411 | 0.4015 | 107 lm |
| 838C | 0.4375 | 0.4154 | 107 lm |

In particular embodiments, each of the sets of complementary light emitters may, as a set, emit combined light when energized having a chromaticity that is within a 2-step MacAdam ellipse of a target chromaticity point. Accordingly, a combined light emitted by the overall device 100 including all of the light emitters may have a chromaticity that is within a 2-step MacAdam ellipse of the target chromaticity point.

Methods according to some embodiments can be applied not only to unpackaged light emitting devices that are assembled into a package, but also to packaged light emitting devices, including multi-chip light emitting devices, that are assembled in luminaire or lighting fixture. For example, referring again to FIG. 12, a luminaire, such as the lighting panel 600, includes a plurality of packaged LEDs 100 that are mounted on a first side of the panel 600 and that emit light combined 610 having a chromaticity within a target chromaticity region for use in general lighting applications.

In some embodiments, each of the packaged LEDs 100 emits light having a particular chromaticity point, which may be a combined light emitted by a plurality of light emitting devices selected for inclusion in the package in accordance with the methods described herein. The packaged LEDs 100 may themselves be binned into chromaticity regions/subregions and selected for inclusion in the luminaire 600 in accordance with the methods described herein so as to provide a luminaire 600 that generates a desired color of light.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of forming a light emitting device assembly, comprising:
   providing a light emitting device assembly body;
   defining a chromaticity region in a two dimensional chromaticity space wherein the chromaticity region is defined within a 10-step MacAdam ellipse of a target chromaticity point, and subdividing the defined chromaticity region into at least three chromaticity subregions;
   providing a plurality of light emitting devices that emit light having a chromaticity that falls within the defined chromaticity region;
   selecting at least three of the plurality of light emitting devices, wherein each of the three light emitting devices has a chromaticity point in a different one of the chromaticity subregions and wherein the at least three light emitting devices are selected from chromaticity subregions that are complementary relative to the target chromaticity point to at least one other chromaticity subregion from which a light emitting device is selected; and
   mounting the selected light emitting devices on the light emitting device assembly body,
   wherein selecting the at least three light emitting devices comprises selecting at least two sets of light emitting devices, wherein each set of light emitting devices comprises at least two light emitting devices selected from chromaticity subregions that are complementary relative to the target chromaticity point,
   wherein the chromaticity region encompasses a defined bin in the two dimensional chromaticity space, and the defined bin comprises a quadrangle on a two dimensional chromaticity space,
   wherein each of the at least three chromaticity subregions at least partially overlaps the defined bin.

2. The method of claim 1, wherein the target chromaticity point is on the black body locus and has a correlated color temperature between 2600K and 6600K.

3. The method of claim 1, wherein combined light from the at least three light emitting devices falls within a target chromaticity region that is a subset of the defined bin.

4. The method of claim 3, wherein the defined chromaticity region is larger than and encompasses the defined bin, and wherein the target chromaticity region touches an edge of the defined bin.

5. The method of claim 3, wherein the target chromaticity region has an area on a two dimensional chromaticity space that is about the size of a 2-step MacAdam ellipse in the two dimensional chromaticity space.

6. The method of claim 3, wherein the target chromaticity region has an area on a two dimensional chromaticity space that is smaller than a 2-step MacAdam ellipse in the two dimensional chromaticity space.

7. The method of claim 1, wherein the light emitting devices comprise phosphor-coated blue light emitting device chips.

8. A method of forming a light emitting device assembly, comprising:
   providing a light emitting device assembly body;
   defining a chromaticity region in a two dimensional chromaticity space wherein the chromaticity region is defined within a 10-step MacAdam ellipse of a target chromaticity point, and subdividing the defined chromaticity region into at least three chromaticity subregions;
   providing a plurality of light emitting devices that emit light having a chromaticity that falls within the defined chromaticity region;
   selecting at least three of the plurality of light emitting devices, wherein each of the three light emitting devices has a chromaticity point in a different one of the chromaticity subregions and wherein the at least three light emitting devices are selected from chromaticity subregions that are complementary relative to the target chromaticity point to at least one other chromaticity subregion from which a light emitting device is selected; and
   mounting the selected light emitting devices on the light emitting device assembly body,
   wherein the chromaticity region comprises a first chromaticity region, and the plurality of light emitting devices comprises a first plurality of light emitting devices, the method further comprising:
   defining a second chromaticity region in a two dimensional chromaticity space wherein the second chromaticity region is defined within a 10-step MacAdam ellipse of a second target chromaticity point and wherein the second chromaticity region does not overlap with the first chromaticity region, and subdividing the second chromaticity region into at least three second chromaticity subregions;
   providing a second plurality of light emitting devices that emit light having a chromaticity that falls within at least one of the second chromaticity subregions;
   selecting at least three of the second plurality of light emitting devices, wherein each of the three light emitting devices of the second plurality of light emitting devices emits light from a different one of the second chromaticity subregions; and
   mounting the selected light emitting devices of the second plurality of light emitting devices on the light emitting device package body.

9. The method of claim 8, wherein the second chromaticity region comprises light having a dominant wavelength greater than about 600 nm.

10. The method of claim 8, further comprising:
    defining a third chromaticity region in a two dimensional chromaticity space, and subdividing the third chromaticity region into at least three third chromaticity subregions wherein the third chromaticity region does not overlap with the first and/or second chromaticity regions;

providing a third plurality of light emitting devices that emit light having a chromaticity that falls within at least one of the third chromaticity subregions;

selecting at least three of the third plurality of light emitting devices, wherein each of the three light emitting devices of the third plurality of light emitting devices emits light from a different one of the third chromaticity subregions; and mounting the selected light emitting devices of the third plurality of light emitting devices on the light emitting device package body.

11. The method of claim 10, wherein the first chromaticity region comprises light having a chromaticity point that is within a 10-step MacAdam ellipse of a point on the black body locus having a correlated color temperature between 2600K and 6600K, the second chromaticity region comprises light having a dominant wavelength greater than about 600 nm, and the third chromaticity region comprises light having x, y color coordinates within an area on a 1931 CIE Chromaticity Diagram defined by points having coordinates (0.32, 0.40), (0.36, 0.48), (0.43, 0.45), (0.42, 0.42), (0.36, 0.38).

12. The method of claim 1, wherein the defined subregions comprise a plurality of pairs of complementary subregions, wherein respective subregions in a pair of complementary subregions are arranged opposite a center point of the chromaticity region from one another, wherein selecting the at least three of the plurality of light emitting devices comprises selecting at least four of the plurality of light emitting devices from at least four chromaticity subregions in pairs from respective pairs of complementary subregions.

13. A method of forming a light emitting device assembly, comprising:

providing a light emitting device assembly body;

defining a chromaticity region in a two dimensional chromaticity space wherein the chromaticity region is defined within a 10-step MacAdam ellipse of a target chromaticity point, and subdividing the defined chromaticity region into at least three chromaticity subregions;

providing a plurality of light emitting devices that emit light having a chromaticity that falls within the defined chromaticity region;

selecting at least three of the plurality of light emitting devices, wherein each of the three light emitting devices has a chromaticity point in a different one of the chromaticity subregions and wherein the at least three light emitting devices are selected from chromaticity subregions that are complementary relative to the target chromaticity point to at least one other chromaticity subregion from which a light emitting device is selected;

mounting the selected light emitting devices on the light emitting device assembly body, wherein the defined subregions comprise a plurality of pairs of complementary subregions, wherein respective subregions in a pair of complementary subregions are arranged opposite a center point of the chromaticity region from one another, wherein selecting the at least three of the plurality of light emitting devices comprises selecting at least four of the plurality of light emitting devices from at least four chromaticity subregions in pairs from respective pairs of complementary subregions, and wherein selecting a pair of light emitting device from one pair of complementary subregions comprises selecting a first light emitting device having a first luminous flux from a first subregion that has a center point that is located a first distance from a center point of the chromaticity region, and selecting a second light emitting device having a second luminous flux from a second subregion that is complementary to the first subregion and that has a center point that is located a second distance from a center point of the chromaticity region, wherein the first distance is smaller than the second distance and wherein the first luminous flux is larger than the second luminous flux.

14. The method of claim 1, wherein the at least three light emitting devices are selected from at least three chromaticity subregions that are complementary relative to the target chromaticity point.

15. A light emitting device assembly, comprising:

a light emitting device assembly body; and at least three light emitting devices on the assembly body, wherein each of the at least three light emitting devices emits light having a chromaticity that falls within a defined chromaticity region in a two dimensional chromaticity space wherein the chromaticity region is defined within a 10-step MacAdam ellipse of a target chromaticity point that is on the black body locus and that has a correlated color temperature between 2600K and 6600K, the defined chromaticity region being subdivided into at least three chromaticity subregions, wherein the at least three light emitting devices emit light when energized that falls within chromaticity subregions that are complementary relative to the target chromaticity point to at least one other chromaticity subregion in which a light emitting device in the light emitting device assembly emits light;

wherein the at least three light emitting devices on the assembly body comprises at least two sets of light emitting devices, wherein each set of light emitting devices comprises at least two light emitting devices selected from chromaticity subregions that are complementary relative to the target chromaticity point, wherein the chromaticity region encompasses a defined bin in the two dimensional chromaticity space, and the defined bin comprises a quadrangle on a two dimensional chromaticity space, wherein each of the at least three chromaticity subregions at least partially overlaps the defined bin.

* * * * *

UNITED STATES PATENT AND TRADEMARK OFFICE
CERTIFICATE OF CORRECTION

PATENT NO. : 8,333,631 B2
APPLICATION NO. : 12/838677
DATED : December 18, 2012
INVENTOR(S) : Emerson et al.

It is certified that error appears in the above-identified patent and that said Letters Patent is hereby corrected as shown below:

In the Drawings:
Please replace Figure 13 with the attached Replacement Sheet

In the Claims:
Column 21, Claim 1, Line 34:
  Please correct "defined within a 10-step MacAdam ellipse of a target"
    to read -- defined only within a 10-step MacAdam ellipse of a target --

Line 36: Please correct "into at least three chromaticity subregions;"
    to read -- into at least four chromaticity subregions; --

Line 40: Please correct "at least three of the plurality of light emitting"
    to read -- at least four of the plurality of light emitting --

Line 41: Please correct "wherein each of the three light emitting devices"
    to read -- wherein each of the four light emitting devices --

Line 43: Please correct "wherein the at least three light"
    to read -- wherein the at least four light --

Line 50: Please correct "wherein selecting the at least three light emitting"
    to read -- wherein selecting the at least four light emitting --

Column 21, Claim 3, Line 66: Please correct "at least three light emitting devices"
    to read -- at least four light emitting devices --

Column 22, Claim 8, Line 22: Please correct "defined within a 10-step MacAdam"
    to read -- defined only within a 10-step MacAdam --

Line 44: Please correct "region is defined within a 10-step MacAdam"
    to read -- region is defined only within a 10-step MacAdam --

Signed and Sealed this
Sixteenth Day of April, 2013

Teresa Stanek Rea
*Acting Director of the United States Patent and Trademark Office*

CERTIFICATE OF CORRECTION (continued)
U.S. Pat. No. 8,333,631 B2

Column 23, Claim 13, Line 39: Please correct "defined within a 10-step MacAdam"
to read -- defined only within a 10-step MacAdam --

Line 46: Please correct "at least three of the plurality"
to read -- at least four of the plurality --

Line 47: Please correct "each of the three light emitting devices"
to read -- each of the four light emitting devices --

Line 49: Please correct "at least three light"
to read -- at least four light --

Column 24, Claim 13, Line 4: Please correct "three of the plurality"
to read -- four of the plurality --

Line 9: Please correct "a pair of light emitting device"
to read -- a pair of light emitting devices --

Column 24, Claim 15, Line 28: Please correct "at least three light emitting"
to read -- at least four light emitting --

Line 29: Please correct at least three light emitting"
to read -- at least four light emitting --

Line 33: Please correct "defined within a 10-step"
to read -- defined only within a 10-step --

Line 37: Please correct "at least three chromaticity"
to read -- at least four chromaticity --

Line 38: Please correct "at least three light emitting"
to read -- at least four light emitting --

Line 44: Please correct "at least three light emitting"
to read -- at least four light emitting --

Line 54: Please correct "at least three chromaticity"
to read -- at least four chromaticity --